(12) United States Patent
Seo et al.

(10) Patent No.: US 9,461,258 B2
(45) Date of Patent: Oct. 4, 2016

(54) LIGHT-EMITTING DEVICE AND ELECTRONIC DEVICE USING THE SAME

(71) Applicant: Semiconductor Energy Laboratory Co., Ltd., Kanagawa-ken (JP)

(72) Inventors: Satoshi Seo, Kanagawa (JP); Hajime Kimura, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 81 days.

(21) Appl. No.: 14/455,376

(22) Filed: Aug. 8, 2014

(65) Prior Publication Data
US 2014/0346538 A1 Nov. 27, 2014

Related U.S. Application Data

(63) Continuation of application No. 11/301,706, filed on Dec. 13, 2005, now Pat. No. 8,803,853.

(30) Foreign Application Priority Data

Dec. 16, 2004 (JP) .................................. 2004-364297
Dec. 24, 2004 (JP) .................................. 2004-374904

(51) Int. Cl.
G09G 5/00 (2006.01)
H01L 51/50 (2006.01)
G09G 3/32 (2016.01)
G09G 3/20 (2006.01)

(52) U.S. Cl.
CPC ......... *H01L 51/5016* (2013.01); *G09G 3/3233* (2013.01); *H01L 51/5036* (2013.01); *G09G 3/2011* (2013.01); *G09G 3/2022* (2013.01); *G09G 3/2074* (2013.01); *G09G 3/2077* (2013.01); *G09G 3/3291* (2013.01); *G09G 2330/028* (2013.01)

(58) Field of Classification Search
CPC ................ H01L 51/50; G09G 3/3291; G09G 2330/028
See application file for complete search history.

(56) References Cited

U.S. PATENT DOCUMENTS

| 4,871,236 A | 10/1989 | Gemma et al. |
| 5,563,621 A | 10/1996 | Silsby |
| 5,691,556 A | 11/1997 | Saito et al. |
| 5,756,224 A | 5/1998 | Borner et al. |

(Continued)

FOREIGN PATENT DOCUMENTS

| EP | 1 351 558 A1 | 10/2003 |
| GB | 2 376 555 A | 12/2002 |

(Continued)

*Primary Examiner* — William Boddie
*Assistant Examiner* — Leonid Shapiro
(74) *Attorney, Agent, or Firm* — Husch Blackwell LLP

(57) ABSTRACT

It is an object to provide a light-emitting device and an electronic device which can provide an image with excellent image quality. One of the present inventions is a light-emitting device including a plurality of light-emitting elements each exhibiting a different emission color. At least one of the plurality of light-emitting elements has n light-emitting layers (n is a natural number, n≥2) between a pair of electrodes. Further, at least one of the n light-emitting layers includes a substance which provides emission from a triplet excitation state. In a light-emitting device having such a structure, an image is displayed by combining emissions from the plurality of light-emitting elements.

18 Claims, 26 Drawing Sheets

(56) References Cited

U.S. PATENT DOCUMENTS

| | | |
|---|---|---|
| 5,789,100 A | 8/1998 | Burroughs et al. |
| 5,958,573 A | 9/1999 | Spitler et al. |
| 6,107,734 A | 8/2000 | Tanaka et al. |
| 6,340,789 B1 | 1/2002 | Petritsch et al. |
| 6,559,375 B1 | 5/2003 | Meissner et al. |
| 6,771,028 B1 * | 8/2004 | Winters .................... 315/169.1 |
| 6,812,399 B2 | 11/2004 | Shaheen et al. |
| 6,872,472 B2 | 3/2005 | Liao et al. |
| 6,917,159 B2 | 7/2005 | Tyan et al. |
| 7,158,161 B2 | 1/2007 | Gyoutoku et al. |
| 7,579,089 B2 | 8/2009 | Seo et al. |
| 2002/0086180 A1 | 7/2002 | Seo et al. |
| 2002/0173068 A1 | 11/2002 | Kido et al. |
| 2003/0127967 A1 | 7/2003 | Tsutsui et al. |
| 2003/0160743 A1 | 8/2003 | Yasuda |
| 2003/0189401 A1 | 10/2003 | Kido et al. |
| 2004/0036421 A1 | 2/2004 | Arnold et al. |
| 2004/0161192 A1 | 8/2004 | Hamano et al. |
| 2005/0029933 A1 | 2/2005 | Liao et al. |
| 2005/0030268 A1 | 2/2005 | Zhang et al. |
| 2005/0156197 A1 | 7/2005 | Tsutsui et al. |
| 2006/0091797 A1 | 5/2006 | Tsutsui et al. |
| 2007/0008257 A1 | 1/2007 | Seo et al. |
| 2007/0182317 A1 * | 8/2007 | Kido et al. .................... 313/504 |

FOREIGN PATENT DOCUMENTS

| | | |
|---|---|---|
| JP | 10-022072 A | 1/1998 |
| JP | 11-307264 A | 11/1999 |
| JP | 11-329748 A | 11/1999 |
| JP | 2000-030868 A | 1/2000 |
| JP | 2000-200061 A | 7/2000 |
| JP | 2003-045676 A | 2/2003 |
| JP | 2003-272860 A | 9/2003 |
| JP | 2004-134395 A | 4/2004 |
| JP | 2005-285469 A | 10/2005 |
| WO | WO 2004/055897 A2 | 7/2004 |
| WO | WO 2005/006460 A1 | 1/2005 |

* cited by examiner

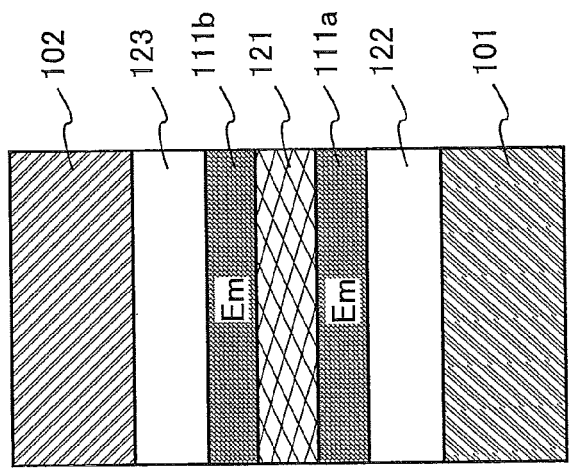
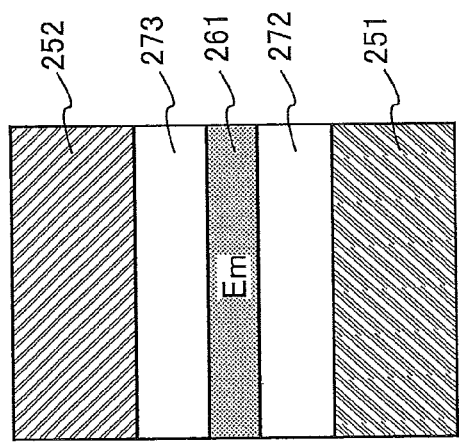
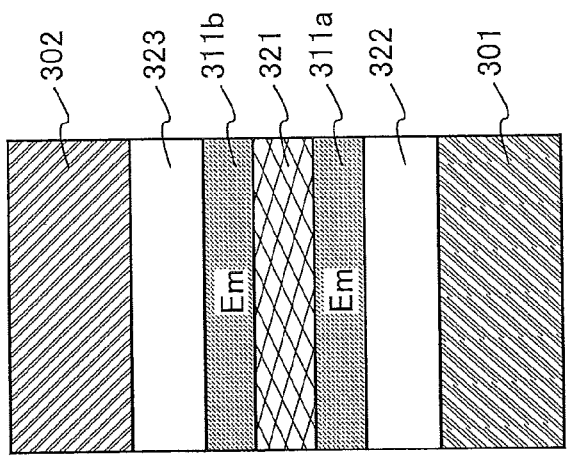

(RGB+W)

LIGHT-EMITTING DEVICE AND ELECTRONIC DEVICE USING THE SAME

This application is a continuation of copending U.S. application Ser. No. 11/301,706, filed on Dec. 13, 2005 which is incorporated herein by reference.

TECHNICAL FIELD

The present invention relates to a light-emitting device using a light-emitting element as a pixel, and an electronic device using such a light-emitting device as a display device.

BACKGROUND OF THE INVENTION

In recent years, a light-emitting device using, as a pixel, a light-emitting element which emits light by current excitation has been developed actively. Such light-emitting devices are incorporated in electronic devices such as a television image receiver, and are known as devices which provide images to users of the electronic devices.

In a light-emitting device, light-emitting elements for red, blue and green are provided. Light emitted from each of the light-emitting elements is combined while changing luminance, emission time and the like, thereby an image having different brightness, chromaticity, or gradation is displayed.

Most of light-emitting devices which have ever been developed have structures of a combination of red light, blue light and green light. However, for example, as described in Patent Document 1, a display device having a structure provided with a light-emitting element for emitting white emission has been developed.

Patent Document 1—Japanese Patent Laid-Open No. 2000-200061 bulletin

It is an object of the present invention to provide a light-emitting device and an electronic device which can provide an image with excellent image quality.

SUMMARY OF THE INVENTION

One embodiment of the present invention is a light-emitting device including a plurality of light-emitting elements each exhibiting a different emission color. At least one of the plurality of light-emitting elements has n light-emitting layers (n is a natural number, n≥2) between a pair of electrodes. In a light-emitting device having such a structure, an image is displayed by combining emissions from the plurality of light-emitting elements.

One embodiment of the present invention is a light-emitting device including a plurality of light-emitting elements each exhibiting a different emission color. At least one of the plurality of light-emitting elements has n light-emitting layers (n is a natural number, n≥2) between a pair of electrodes. Further, at least one of the n light-emitting layer includes a substance which provides emission from a triplet excitation state. In a light-emitting device having such a structure, an image is displayed by combining emissions from the plurality of light-emitting elements.

One embodiment of the present invention is a light-emitting device including a plurality of light-emitting elements each exhibiting a different emission color. At least one of the light-emitting elements has n light-emitting layers (n≥2, a natural number) between a pair of electrodes. In the n light-emitting layers, between a m-th light-emitting layer (m is a natural number) and a (m+1)-th light-emitting layer, a layer is provided, which has a larger ionization potential than an ionization potential of the m-th light-emitting layer and which has a smaller electron affinity than an electron affinity of the (m+1)-th light-emitting layer. In the light-emitting device having such a structure of the present invention, an image is displayed by combining emissions from the light-emitting elements.

One embodiment of the present invention is a light-emitting device including a plurality of light-emitting elements each exhibiting a different emission color. At least one of the light-emitting elements has n light-emitting layers (n≥2, n is a natural number) between a pair of electrodes. Further, at least one of the n light-emitting layers includes a substance exhibiting emission from a triplet excited state. In the n light-emitting layers, between a m-th light-emitting layer (m is a natural number) and a (m+1)-th light-emitting layer, a layer is provided, which has a larger ionization potential than an ionization potential of the m-th light-emitting layer and which has a smaller electron affinity than an electron affinity of the (m+1)-th light-emitting layer. In the light-emitting device having such a structure of the present invention, an image is displayed by combining emissions from the light-emitting elements.

One embodiment of the present invention is a light-emitting device including a plurality of light-emitting elements each exhibiting a different emission color. At least one of the light-emitting elements has n light-emitting layers (n≥2, a natural number) between a pair of electrodes. In the n light-emitting layers, between a m-th light-emitting layer (m is a natural number) and a (m+1)-th light-emitting layer, a layer is provided, which includes an aromatic amine compound as well as a metal oxide including a metal atom belonging to any of Groups 4 to 8. In the light-emitting device having such a structure of the present invention, an image is displayed by combining emissions from the light-emitting elements.

One embodiment of the present invention is a light-emitting device including a plurality of light-emitting elements each exhibiting a different emission color. At least one of the light-emitting elements has n light-emitting layers (n≥2, n is a natural number) between a pair of electrodes. Further, at least one of the n light-emitting layers includes a substance exhibiting emission from a triplet excited state. Between a m-th light-emitting layer (m is a natural number) and a (m+1)-th light-emitting layer, a layer is provided, which includes an aromatic amine compound as well as a metal oxide including a metal atom belonging to any of Groups 4 to 8. In the light-emitting device having such a structure of the present invention, an image is displayed by combining emissions from the light-emitting elements.

In the light-emitting device described above, respective light-emitting substances included in the n light-emitting layers may exhibit different emission colors.

One embodiment of the present invention is that, in the light-emitting device described above, a plurality of power source potentials are included and to the light-emitting elements each exhibiting a different emission color, respective different power source potentials are applied. Further, the plurality of power source potentials are generated by a voltage step-up circuit.

In the light-emitting device described above, a charge pump may be used as the voltage set-up circuit.

One embodiment of the present invention is that in the light-emitting device described above, the charge pump including a constant voltage source; a first rectifying element to an N-th rectifying element (N≥2, N is a natural number); and a first capacitor element to an N-th capacitor element. And the first rectifying element to the N-th rectifying element are connected in series, and an input terminal of the first rectifying element is connected to the constant voltage source. One electrode of each of the first capacitor element to the N-th capacitor element is connected to an output terminal of each of the first rectifying element to the N-th rectifying element. A clock pulse or a clock inverted pulse is inputted alternately to the other electrode of each of the first capacitor element to the (N−1)-th capacitor element, and a predetermined potential is inputted to the other electrode of the N-th capacitor element. A power source potential to be applied to the light-emitting element is obtained from an arbitrary one electrode of each of the first capacitor element to the N-th capacitor element.

One embodiment of the present invention is a light-emitting device including a first light-emitting element including a first light-emitting layer between a pair of electrodes; a second light-emitting element including a second light-emitting layer between a pair of electrodes; a third light-emitting element including a third light-emitting layer between a pair of electrodes; and a fourth light-emitting element including the first light-emitting layer, the second light-emitting layer and the third light-emitting layer between a pair of electrodes. Here, the fourth light-emitting element is adjacent to each of the first light-emitting element, the second light-emitting element and the third light-emitting element. A plurality of groups each having the first light-emitting element, the second light-emitting element, the third light-emitting element and the fourth light-emitting element as one set are arranged, and each of the groups serves as a pixel.

One embodiment of the present invention is a television image receiver in which a module including a light-emitting device and a circuit board is incorporated in a casing. Here, the light-emitting device includes a plurality of light-emitting elements each exhibiting a different emission color. And at least one of the light-emitting elements has n light-emitting layers (n≥2, n is a natural number) between a pair of electrodes. In the television image receiver including the light-emitting device with such a structure, an image is displayed by combining emissions from the light-emitting elements.

One embodiment of the present invention is a television image receiver in which a module including a light-emitting device and a circuit board is incorporated in a casing. Here, the light-emitting device includes a plurality of light-emitting elements each exhibiting a different emission color. And at least one of the light-emitting elements has n light-emitting layers (n≥2, n is a natural number) between a pair of electrodes. At least one of the light-emitting layers includes a substance exhibiting emission from a triplet excited state. In the television image receiver including the light-emitting device with such a structure, an image is displayed by combining emissions from the light-emitting elements.

One embodiment of the present invention is a television image receiver in which a module including a light-emitting device and a circuit board is incorporated in a casing. Here, the light-emitting device includes a plurality of light-emitting elements each exhibiting a different emission color. And at least one of the light-emitting elements has n light-emitting layers (n≥2, n is a natural number) between a pair of electrodes. In the n light-emitting layers, between a m-th light-emitting layer (m is a natural number) and a (m+1)-th light-emitting layer, a layer is provided, which has a larger ionization potential than an ionization potential of the m-th light-emitting layer and which has a smaller electron affinity than an electron affinity of the (m+1)-th light-emitting layer. In the television image receiver including the light-emitting device with such a structure, an image is displayed by combining emissions from the light-emitting elements.

One embodiment of the present invention is a television image receiver in which a module including a light-emitting device and a circuit board is incorporated in a casing. Here, the light-emitting device includes a plurality of light-emitting elements each exhibiting a different emission color. And at least one of the light-emitting elements has n light-emitting layers (n≥2, n is a natural number) between a pair of electrodes. In the n light-emitting layers, between a m-th light-emitting layer (m is a natural number) and a (m+1)-th light-emitting layer, a layer is provided, which has a larger ionization potential than an ionization potential of the m-th light-emitting layer and which has a smaller electron affinity than an electron affinity of the (m+1)-th light-emitting layer. In the television image receiver including the light-emitting device with such a structure, an image is displayed by combining emissions from the light-emitting elements.

One embodiment of the present invention is a television image receiver in which a module including a light-emitting device and a circuit board is incorporated in a casing. Here, the light-emitting device includes a plurality of light-emitting elements each exhibiting a different emission color. And at least one of the light-emitting elements has n light-emitting layers (n≥2, n is a natural number) between a pair of electrodes. In the n light-emitting layers, between a m-th light-emitting layer (m is a natural number) and a (m+1)-th light-emitting layer, a layer is provided, which includes an aromatic amine compound as well as a metal oxide including a metal atom belonging to any of Groups 4 to 8. In the television image receiver including the light-emitting device with such a structure, an image is displayed by combining emissions from the light-emitting elements.

One embodiment of the present invention is a television image receiver in which a module including a light-emitting device and a circuit board is incorporated in a casing. Here, the light-emitting device includes a plurality of light-emitting elements each exhibiting a different emission color. And at least one of the light-emitting elements has n light-emitting layers (n≥2, n is a natural number) between a pair of electrodes. At least one of the light-emitting layers includes a substance exhibiting emission from a triplet excited state. In the n light-emitting layers, between a m-th light-emitting layer (m is a natural number) and a (m+1)-th light-emitting layer, a layer is provided, which includes an aromatic amine compound as well as a metal oxide including a metal atom belonging to any of Group 4 to 8. In the television image receiver including the light-emitting device with such a structure, an image is displayed by combining emissions from the light-emitting elements.

In the television image receiver described above, respective light-emitting substances included in the n light-emitting layers may exhibit different emission colors.

One embodiment of the present invention is a television image receiver in which a module including a light-emitting device and a circuit board is incorporated in a casing. The light-emitting device includes a light-emitting element including a first light-emitting layer, a second light-emitting layer and a third light-emitting layer between a pair of electrodes. In such a light-emitting element, the first light-emitting layer includes a light-emitting substance exhibiting reddish emission, the second light-emitting layer includes a light-emitting substance exhibiting greenish emission, and the third light-emitting layer includes a light-emitting substance exhibiting bluish emission.

One embodiment of the present invention is a television image receiver in which a module including a light-emitting device and a circuit board are incorporated in a casing. The light-emitting device includes a light-emitting element including a first light-emitting layer and a second light-emitting layer between a pair of electrodes. In such a light-emitting element, the first light-emitting layer includes a light-emitting substance exhibiting reddish yellow emission and the second light-emitting layer includes a light-emitting substance exhibiting bluish emission.

One embodiment of the present invention is a television image receiver in which a module including a light-emitting device and a circuit board is incorporated in a casing. Here, the light-emitting device includes a light-emitting element including a first light-emitting layer and a second light-emitting layer between a pair of electrodes. In such a light-emitting element, the first light-emitting layer includes a light-emitting substance exhibiting reddish emission and the second light-emitting layer includes a light-emitting substance exhibiting blue-greenish emission.

In the present invention, a reddish color means a color whose coordinate is in the range where x is 0.60 or more and y is 0.40 or less in the chromaticity diagram when adopting CIE-XYZ color system. A greenish color means a color whose coordinate is in the range where x is 0.30 or less and y is 0.60 or more. in the chromaticity diagram when adopting CIE-XYZ color system. A bluish color means a color whose coordinate is in the range where x is 0.20 or less and y is 0.20 or less in the chromaticity diagram when adopting CIE-XYZ color system. In addition, a blue-green color means a color whose coordinate is in the range where x is 0.20 or less and y is 0.25 or more but 0.5 or less in the chromaticity diagram when adopting CIE-XYZ color system. Note that the CIE-XYZ color system is a color system based on tristimulus values X, Y, and Z. Further, a reddish yellow based color means a color whose coordinate is in the range where x is 0.40 or more but 0.55 or less and y is 0.40 or more in the chromaticity diagram when adopting CIE-XYZ color system. Note that the CIE-XYZ color system is a color system based on tristimulus values X, Y, and Z. The chromaticity diagram shows colors by a coordinate space of x and y based on tristimulus values X, Y, and Z. Chromaticity is the color type from which brightness is excepted, which is quantitatively defined.

By implementing the present invention, a light-emitting device can be provided which has a light-emitting element having a higher luminance when an arbitrary current flows thereto. In addition, by incorporating such a light-emitting device, a television image receiver with excellent image quality can be obtained.

By implementing the present invention, the luminance of light extracted to the outside when an arbitrary current flows thereto can be adjusted not only by a value of a current supplied to a light-emitting element, but also by changing the number of light-emitting layers included in one light-emitting element. Thus, a light-emitting device which can display a favorable image with good balance of luminance of each color, can be obtained. By incorporating such a light-emitting device, a television image receiver with excellent image quality can be obtained.

BRIEF DESCRIPTION OF THE DRAWINGS

FIGS. 2(A)-2(C) are diagrams showing modes of a light-emitting element included in a light-emitting device of the present invention.

DETAILED DESCRIPTION OF THE PRESENTLY PREFERRED EMBODIMENTS

Hereinafter, one mode of the present invention will be described. However, the present invention can be carried out in many different modes, and it is easily understood by those skilled in the art that modes and details herein disclosed can be modified in various ways without departing from the spirit and the scope of the present invention. Therefore, it should be noted that the present invention should not be interpreted as being limited to the description of the embodiment modes.

Embodiment Mode 1

A mode of a light-emitting element included in a light-emitting device of the present invention will be described with reference to FIGS. 1(A) to 1(C). In the light-emitting element of the present invention, a first light-emitting element shown in FIG. 1(A), a second light-emitting element shown in FIG. 1(B), a third light-emitting element shown in FIG. 1(C) are provided. Each light emitted from the first light-emitting element, the second light-emitting element, and the third light-emitting element is different in color. There are no particular limitations on the color of light emitted from the light-emitting elements. In this embodiment mode, description is made on a case where the first light-emitting element emits reddish light, the second light-emitting element emits greenish light, and the third light-emitting element emits bluish light.

Figure 1A:
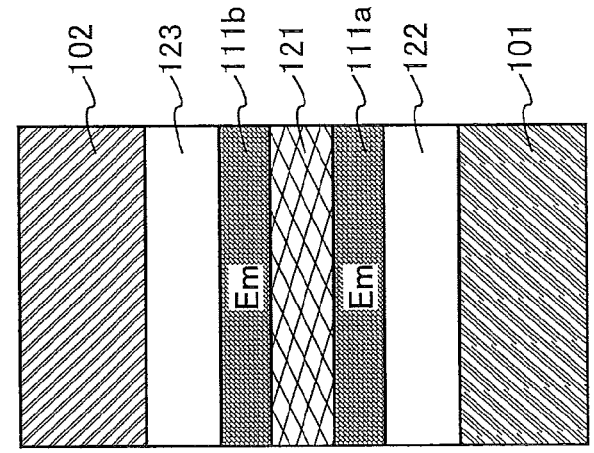
FIGS. 1(A)-1(C) are diagrams showing modes of a light-emitting element included in a light-emitting device of the present invention.

In the light-emitting element shown in FIG. 1(A), a first light-emitting layer 111a and a second light-emitting layer 111b are provided between the first electrode 101 and the second electrode 102. Between the first light-emitting layer 111a and the second light-emitting layer 111b, a first layer 121 is provided. The first layer 121 serves as a layer for preventing excitation energy from moving only in any one direction of the first light-emitting layer 111a and the second light-emitting layer 111b, or an electron generation layer.

First, described is a case where the first layer 121 serves as a layer for preventing excitation energy from moving only in any one direction of the first light-emitting layer 111a and the second light-emitting layer 111b. In this case, the light-emitting element operates as follows: When a voltage is applied to the first electrode 101 and the second electrode 102 such that a potential of the first electrode 101 becomes higher than that of the second electrode 102, holes are injected to the first layer 121 from the first electrode 101 side, and electrons are injected to the first layer 121 from the second electrode 102 side. In at lease one layer of the first layer 121, the first light-emitting layer 111a, and the second light-emitting layer 111b, electrons and holes are recombined to generate excitation energy. Light-emitting substances included in the first light-emitting layer 111a and the second light-emitting layer 111b are excited by the generated excitation energy thus generated, and then, light is emitted when it returns to a ground state. In the light-emitting layer 121, the first layer 121 has a larger ionization potential than an ionization potential of the first light-emitting layer 111a, and is preferably a layer having a higher LUMO level than a LUMO level in the second light-emitting layer 111b. In addition, the first layer 121 is preferably formed so as to have a thickness of 1 nm to 30 nm. By providing the first layer 121 between the first light-emitting layer 111a and the second light-emitting layer 111b, it can be prevented that the excitation energy moves only in any one direction of the first light-emitting layer 111a and the second light-emitting layer 111b.

Here, light-emitting substance included in each of the first light-emitting layer 111a and the second light-emitting layer 111b is not limited especially. It may be a substance which emits fluorescence, or a substance which emits phosphorescence. Here, each of the first light-emitting layer 111a and the second light-emitting layer 111b may be a layer including only a light-emitting substance or a layer in which a light-emitting substance is dispersed in a substance having a larger energy gap than the light-emitting substance. In the present invention, a light-emitting substance refers to a substance which has a favorable emission efficiency and which can emit light in a desired emission wavelength. As specific examples of a light-emitting element which can be used in a case of emitting reddish light, like the first light-emitting element, the following substances exhibiting emission spectrum with peaks at 600 to 680 nm can be employed:
4-dicyanomethylene-2-isopropyl-6-[2-(1,1,7,7-tetramethyl-julolidine-9-yl)ethenyl]-4H-pyran (abbreviated to DCJTI); 4-dicyanomethylene-2-methyl-6-[2-(1,1,7,7-tetramethyl-julolidine-9-yl)ethenyl]-4H-pyran (abbreviated to DCJT); 4-dicyanomethylene-2-tert-butyl-6-[2-(1,1,7,7-tetramethyl-julolidine-9-yl)ethenyl]-4H-pyran (abbreviated to DCJTB); periflanthene; 2,5-dicyano-1,4-bis[2-(10-methoxy-1,1,7,7-tetramethyljulolidine-9-yl)ethenyl]benzene and the like, are given. In addition to the substances which emits fluorescence, a material which emits phosphorescence, such as (acetylacetonato)bis[2-(2-benzothienyl)pyridinato]iridium (III) (abbreviated to Ir(btp)$_2$(acac)), or (2,3,7,8,12,13,17,18-octaethyl-21H,23H-porphyrinato)platinum(II) can be used as the light-emitting substance which provides reddish light. Note that the light-emitting substances included in the first light-emitting layer 111a and the second light-emitting layer 111b may be the same or different. A substance which is included in the first light-emitting layer 111a or the second light-emitting layer 111b together with the light-emitting substance and which is used for dispersing the light-emitting substance is not limited especially, and it may be selected appropriately in consideration of an energy gap or the like of a substance to be used as the light-emitting substance. For example, an anthracene derivative such as 9,10-di(2-naphthyl)-2-tert-butylanthracene (abbreviated to t-BuDNA); a carbazole derivative such as 4,4'-bis(N-carbazolyl)biphenyl (abbreviated to CBP); a quinoxaline derivative such as 2,3-bis(4-diphenylaminophenyl)quinoxaline (abbreviated to TPAQn), 2,3-bis{4-[N-(1-naphthyl)-N-phenylamino]phenyl}-dibenzo[f,h]quinoxaline (abbreviated to NPADiBzQn); a metal complex such as bis[2-(2-hydroxyphenyl)pyridinato]zinc (abbreviated to Znpp$_2$) and bis[2-(2-hydroxyphenyl)benzoxazolato]zinc (abbreviated to ZnBOX$_2$), or the like can be used with the light-emitting substance.

In addition, a hole transporting layer 122 may be provided between the first light-emitting layer 111a and the first electrode 101 as shown in FIG. 1. Here, the hole transporting layer is a layer having a function of transporting holes injected from the first electrode 101 side to the first light-emitting layer 111a side. Like this, by providing the hole transporting layer 122, the distance between the first electrode 101 and the first light-emitting layer 111a can be increased. As a result, it can be prevented that light is quenched due to a metal included in the first electrode 101. The hole transporting layer is preferably formed using a material having a high hole transporting property, in particular, preferably formed using a substance having a hole mobility of $1\times10^{-6}$ cm$^2$/Vs or more. Note that the substance having a high hole transporting property is a substance which has a higher hole mobility than an electron mobility, and in which the ratio value of hole mobility to electron mobility (=hole mobility/electron mobility) is 100 or more. As specific examples of a substance which can be used for forming the hole transporting layer 122, 4,4'-bis[N-(1-naphthyl)-N-phenylamino]biphenyl (abbreviated to NPB); 4,4'-bis[N-(3-methylphenyl)-N-phenylamino]biphenyl (abbreviated to TPD); 4,4',4"-tris(N,N-diphenylamino) triphenylamine (abbreviated to TDATA); 4,4',4"-tris[N-(3- methylphenyl)-N-phenylamino]triphenylamine (abbreviated to MTDATA); and 4,4'-bis{N-[4-(N,N-di-m-tolylamino)phenyl]-N-phenylamino}biphenyl (DNTPD); 1,3,5-tris[N,N-di(m-tolyl)amino]benzene (abbreviated to m-MTDAB); 4,4',4''-tris(N-carbazolyl)-triphenylamine (abbreviated to TCTA); phthalocyanine (abbreviated to $H_2Pc$); copper phthalocyanine (abbreviated to CuPc); (vanadyl phthalocyanine (abbreviated to VOPc), and the like are given. In addition, the hole transporting layer 122 may have a multilayer structure including two or more layers made of the substances described above.

Furthermore, a hole-injecting layer may be provided between the first electrode 101 and the hole-transporting layer 122 as shown in FIG. 1. The hole-injecting layer is a layer having a function to assist holes to be injected to the hole-transporting layer 122 from the first electrode 101. By providing the hole-injecting layer, the ionization potential difference between the first electrode 101 and the hole-transporting layer 122 is relieved; thus, holes are easily injected. The hole-injecting layer is preferably formed using a substance of which ionization potential is lower than that of a substance forming the hole-transporting layer 122 and higher than that of a substance forming the first electrode 101 or using a substance of which energy band curves when provided as a thin film of 1 nm to 2 nm between the hole-transporting layer 122 and the first electrode 101. As for a specific example of a substance that can be used to form the hole-injecting layer, a phthalocyanine-based compound such as phthalocyanine (abbreviated to $H_2Pc$) or copper phthalocyanine (CuPc), a polymer such as poly (ethylenedioxythiophene)/poly (styrenesulfonic acid) solution (PEDOT/PSS), and the like can be given. That is, by selecting a substance so that an ionization potential of the hole injecting layer becomes comparatively smaller than an ionization potential of the hole transporting layer 122, the hole injecting layer can be formed. Note that in the case of providing the hole injecting layer, the first electrode 101 is preferably formed using a substance with a high work function such as indium tin oxide.

In addition, an electron transporting layer 123 may be provided between a second electrode 102 and a second light-emitting layer 111b as shown in FIG. 1. Here, the electron transporting layer has a function of transporting electrons injected from the second electrode 102 to the second light-emitting layer 111b side. By providing the electron transporting layer 123 in this manner, the distance between the second electrode 102 and the second light-emitting layer 111b can be increased. As a result, it can be prevented that light is quenched due to a metal included in the second electrode 102. The electron transporting layer is preferably faulted using a substance having a high electron transporting property, in particular, preferably formed using a substance having an electron mobility of $1 \times 10^{-6}$ cm$^2$/Vs or more is preferable. Note that the substance having high hole transporting property indicates a substance having higher mobility of electrons than that of holes, where a ratio value of electron mobility to hole mobility (=electron mobility/hole mobility) is more than 100. As a specific example of a substance that can be used to form the electron-transporting layer 123: 2-(4-biphenylyl)-5-(4-tert-buthylphenyl)-1,3,4-oxadiazole (abbreviated to PBD); 1,3-bis[5-(p-tert-buthylphenyl)-1,3,4-oxadiazole-2-yl]benzene (abbreviated to OXD-7); 3-(4-tert-buthylphenyl)-4-phenyl-5-(4-biphenylyl)-1,2,4-triazole (abbreviated to TAZ); 3-(4-tert-buthylphenyl)-4-(4-ethylphenyl)-5-(4-biphenylyl)-1,2,4-triazole (abbreviated to p-EtTAZ); bathophenanthroline (abbreviated to BPhen); bathocuproin (abbreviated to BCP); 4,4-bis(5-methylbenzoxazol-2-yl)stilbene (abbreviated to BzOs); and the like can be given, as well as metal complexes such as tris(8-quinolinolato)aluminum (abbreviated to Alq$_3$); tris(4-methyl-8-quinolinolato)aluminum (abbreviated to Almq$_3$); bis(10-hydroxybenzo[h]-quinolinato)berylium (BeBq$_2$); bis (2-methyl-8-quinolinolato)-4-phenylphenolato-aluminum (abbreviated to BAlq); bis[2-(2-hydroxyphenyl)benzoxazolate]zinc (abbreviated to Zn(BOX)$_2$); and bis[2-(2-hydroxyphenyl)benzothiazolato]zinc (abbreviated to Zn(BTZ)$_2$). In addition, the electron-transporting layer 123 may also be a multilayer where two or more layers formed of the above substances are combined.

An electron injecting layer may be provided between the second electrode 102 and the electron transporting layer 123 as shown in FIG. 1. Here, the electron-injecting layer is a layer having a function to assist electrons to be injected to the electron-transporting layer 123 from the second electrode 102. By providing the electron-injecting layer, the electron affinity difference between the second electrode 102 and the electron-transporting layer 123 is relieved; thus, electrons are easily injected. The electron-injecting layer is preferably formed using a substance of which electron affinity is higher than that of a substance forming the electron-transporting layer 123 and lower than that of a substance forming the second electrode 102 or using a substance of which energy band curves by being provided as a thin film of 1 nm to 2 nm between the electron-transporting layer 123 and the second electrode 102. As a specific example of a substance that can be used to form the electron-injecting layer: inorganic matter such as alkaline metal, alkaline earth metal, fluoride of alkaline metal, fluoride of alkaline earth metal, oxide of alkaline metal, or oxide of alkaline earth metal can be given. In addition to the inorganic matter, a substance that can be used to form the electron-transporting layer 123 such as BPhen, BCP, BCP, p-EtTAZ, TAZ, or BzOs can also be used as a substance for forming the electron-injecting layer by selecting a substance of which electron affinity is larger than that of a substance for forming the electron-transporting layer 123 from these substances. In other words, by selecting a substance such that the electron affinity in the electron-injecting layer is comparatively higher than the electron affinity in the electron transporting layer 123, the electron-injecting layer can be formed. Note that in the case of providing the electron-injecting layer, the second electrode 102 is preferably formed using a substance having a lower work function such as aluminum.

Note that the hole-transporting layer 122 and the electron-transporting layer 123 may be each formed by using a bipolar substance in addition to the above substances. The bipolar substance indicates a substance in which mobility of either carrier of an electron or a hole is compared with mobility of the other carrier, a ratio value of one carrier mobility to the other carrier mobility is 100 or less, preferably 10 or less. As for the bipolar substance, for example, 2,3-bis(4-diphenylaminophenyl)quinoxaline (abbreviated to TPAQn); 2,3-bis{4-[N-(1-naphthyl)-N-phenylamino]phenyl}-dibenzo[f,h]quinoxaline (abbreviated to NPADiBzQn); and the like can be given. It is preferable to particularly use a substance of which hole and electron mobility is $1 \times 10^{-6}$ cm$^2$/Vs or more among the bipolar substances. In addition, the hole-transporting layer 122 and the electron-transporting layer 123 may be formed by using the same bipolar substance.

Figure 14:
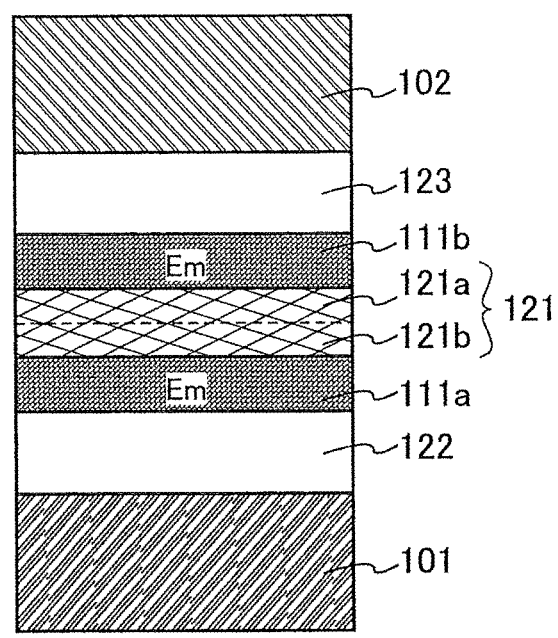
FIG. 14 is a diagram showing a mode of a light-emitting element included in a light-emitting device of the present invention.

Next, a case where the first layer 121 serves as a charge generating layer is described with reference to FIG. 14. In this case, a light-emitting element operates as follows: a voltage is applied to the first electrode 101 and the second electrode 102 such that a potential of the first electrode 101 is higher than a potential of the second electrode 102. At this time, holes are injected into the first layer 121 side from the first electrode 101 side, and electrons are injected into the first layer 121 side from the second electrode 102 side. In addition, electrons moves from the first layer 121 to the first electrode 101, and holes moves from the first layer 121 to the second electrode 102. In each the light-emitting layer 111a and the second light-emitting layer 111b, the electrons and holes are recombined to generate excitation energy. By the generated excitation energy, the light-emitting substance is excited and when it returns to a ground state, light is emitted.

When the first layer 121 serves as a charge generating layer, the first layer 121 is preferably a stacked layer of the first layer 121a and the first layer 121b. It is preferable that the first layer 121a is provided closer to that second electrode 102 than the first layer 121b, and is a mixed layer of a metal oxide and an organic matter. As the metal oxide, metal oxides such as molybdenum oxide, vanadium oxide, ruthenium oxide, or rhenium oxide are preferable. However, other than the above, metal oxides such as titanium oxide, chromium oxide, zirconium oxide, hafnium oxide, tantalum oxide, tungsten oxide, and silver oxide may also be used. As the organic matter, a substance showing an electron donating property to such metal oxides is preferable, aromatic amine compound having a triphenylamine skeleton are preferable in particular, such as 4,4'-bis[N-(1-naphthyl)-N-phenylamino]biphenyl (abbreviated to NPB); 4,4'-bis[N-(3-methylphenyl]-N-phenylamino]biphenyl (abbreviated to TPD); 4,4',4"-tris(N,N-diphenylamino)triphenylamine (abbreviated to TDATA); 4,4',4"-tris[N-(3-methylphenyl)-N-phenylamino]triphenylamine (abbreviated to MTDATA); and 4,4'-bis{N-[4-(N,N-di-m-tolylamino)phenyl]-N-phenylamino}biphenyl (abbreviated to DNTPD); 1,3,5-tris[N,N-di(m-tolyl)amino]benzene (abbreviated to m-MTDAB); 4,4',4"-tris(N-carbazolyl)-triphenylamine (abbreviated to TCTA). The first layer 121a having the above structure can generate holes.

In addition, when the first layer 121 serves as the charge generating layer, the first layer 121b is preferably a layer formed by mixing at least one substance selected from substances having higher mobility of electrons than that of holes and bipolar substances, with a substance that shows an electron-donating property to the substances. Here, as for the substance having higher mobility of electrons than that of holes, the same substance as the substance that can be used to form the electron-transporting layer can be used. Moreover, as for the bipolar substance, the above bipolar substance such as TPAQn can be used. Further, as the substance that shows an electron-donating property, a substance selected from alkaline metals or alkaline earth metals, specifically lithium (Li), calcium (Ca), sodium (Na), magnesium (Mg), or the like can be used. In addition, alkaline metal oxide, alkaline earth metal oxide, alkaline metal nitride or alkaline earth metal nitride, specifically at least one substance of lithium oxide ($Li_2O$), calcium oxide (CaO), sodium oxide ($Na_2O$), potassium oxide ($K_2O$), magnesium oxide (MgO), and the like can also be used. Moreover, alkaline metal fluoride or alkaline earth metal fluoride, specifically at least one substance of lithium fluoride (LiF), cesium fluoride (CsF), calcium fluoride ($CaF_2$), and the like can also be used as the substance that shows electron-donating properties. The first layer 121b having the above structure can generate electrons.

An electron transporting layer is preferably formed between the first layer 121b and the first light-emitting layer 111a. Note that as for the mode of the electron transporting layer, the description about the electron transporting layer 123 described above is referred to. Further, a hole transporting layer is preferably formed between the first layer 121a and the second light-emitting layer 111b. Note that as for the mode of the hole transporting layer, the description about the hole transporting layer 122 described above is referred to.

Note that there are no particular limitations on the first electrode 101 and the second electrode 102; however, at least one of the first electrode 101 and the second electrode 102 is preferably using a conductor which can be used as a transparent electrode such as indium tin oxide, indium tin oxide containing silicon, or indium oxide containing zinc oxide at 2 to 20%, so that it can transmit visible light. However, it is not limited to such conductors, and gold (Au), platinum (Pt), nickel (Ni), tungsten (W), chromium (Cr), molybdenum (Mo), iron (Fe), cobalt (Co), copper (Cu), palladium (Pd) or the like can be used for the first electrode 101 or the second electrode 102, as long as it can be formed to be thick enough to transmit visible light. In addition, aluminum, further, an alloy of magnesium and silver, an alloy of aluminum and lithium or the like may be used.

Figure 1B:
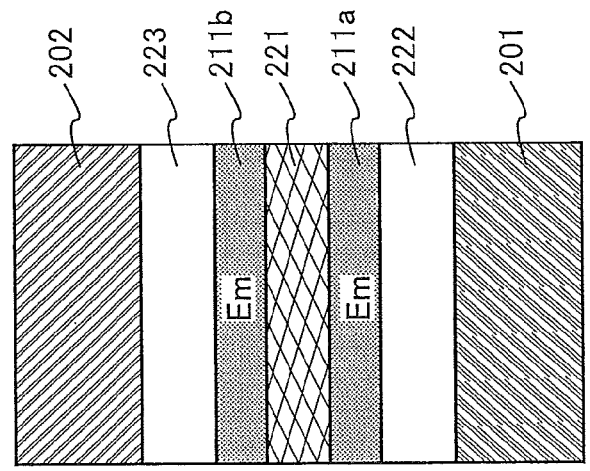
Figure 1C:
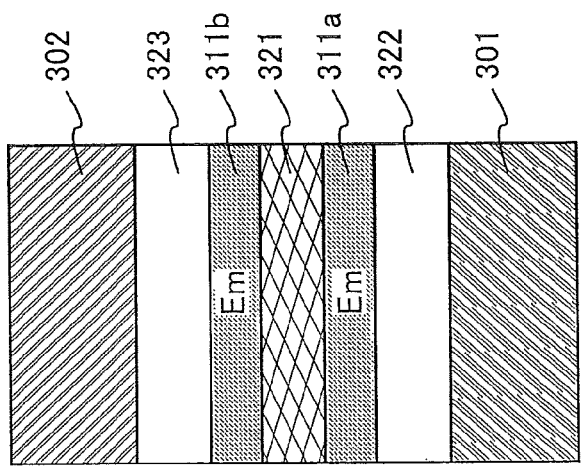

Next, a second light-emitting element shown in FIG. 1(B) is described. The second light-emitting element shown in FIG. 1(B) has a plurality of light-emitting layers between a pair of electrodes, similarly to the light-emitting element shown in FIG. 1(A). A first light-emitting layer 211a and a second light-emitting layer 211b are included between the first electrode 201 and the second electrode 202. A first layer 221 is provided between the first light-emitting layer 211a and the second light-emitting layer 211b. In addition, between the first light-emitting layer 211a and the first electrode 201, a hole transporting layer 222 is provided. Between the first light-emitting layer 211b and the second electrode 202, an electron transporting layer 223 is provided. As for the modes of the first light-emitting layer 211a and the second light-emitting layer 211b, the description of the first light-emitting layer 111a and the second light-emitting layer 111b mentioned above is referred to respectively. Note that light-emitting substances thereof are different from those included in the first light-emitting layer 111a and the second light-emitting layer 111b etc. Specifically, in the first light-emitting layer 211a and the second light-emitting layer 211b, substances exhibiting emission spectrum with peaks at 500 to 550 nm such as N,N'-dimethylquinacridon (abbreviated to DMQd); coumarin 6; coumarin 545T; and tris(8-quinolinolato)aluminum (abbreviated to $Alq_3$) are included as a light-emitting substance. In addition to the substances which emit fluorescence, substances which emit phosphorescence, such as tris(2-phenylpyridinato)iridium(III), (acetylacetonato)bis(2-phenylpyridinato)iridium(III) may be used as a light-emitting substance.

Note that as for the first layer 221, the hole transporting layer 222, and the electron transporting layer 223, the description of the first layer 121, the hole transporting layer 122 and the electron transporting layer 123 described above is refer to respectively.

Next, a third light-emitting element shown in FIG. 1(C) is described. The third light-emitting element shown in FIG. 1(C) has a plurality of light-emitting layers between a pair of electrodes, in a similar manner to the light-emitting element shown in FIG. 1(A). It has a first light-emitting layer 311a and a second light-emitting layer 311b between the first electrode 301 and the second electrode 302. A first layer 321 is provided between the first light-emitting layer 311a and the second light-emitting layer 311b. Further, a hole transporting layer 322 is provided between the first light-emitting layer 311a and the first electrode 301. In addition, an electron transporting layer 323 is included between the second light-emitting layer 311b and the second electrode 302. As for the modes of the first light-emitting layer 311a and the second light-emitting layer 311b, the description of the first light-emitting layer 111a and the second light-emitting layer 111b mentioned above may be referred to respectively. However, light-emitting substances thereof are different from those included in the first light-emitting layer 111a and the second light-emitting layer 111b etc. Specifically, a substance exhibiting emission spectrum with peaks at 420 to 470 nm can be employed, such as 9,10-bis(2-naphthyl)-tert-butylanthracene (abbreviated to t-BuDNA); 9,9'-bianthryl; 9,10-diphenylanthracene (abbreviated to DPA); or 9,10-bis(2-naphthyl)anthracene (abbreviated to DNA) is included in each of the first light-emitting layer 311a and the second light-emitting layer 311b. In addition to the substances which emit fluorescence, a substance which emits phosphorescence, such as bis[2-(4,6-difluorophenyl) pyridinato](tetrapyrazolylboronato)iridium(III), may be used as a light-emitting substance.

Note that as for the first layer 321, the hole transporting layer 322, and the electron transporting layer 323, the description of the first layer 121, the hole transporting layer 122 and the electron transporting layer 123 are referred to respectively.

In the light-emitting devices as described above, the first light-emitting layer 111a (or the first light-emitting layer 211a or the first light-emitting layer 311a) and the second light-emitting layer 111b (or the second light-emitting layer 211b or the second light-emitting layer 311b) emit light. That is, since light can be extracted at the same time from both the first light-emitting layer 111a (or the first light-emitting layer 211a or the first light-emitting layer 311a) and the second light-emitting layer 111b (or the second light-emitting layer 211b or the second light-emitting layer 311b), luminance of emission taken out is increased in accordance with the current flowing to the light-emitting element. Consequently, a vivid display with high luminance can be performed.

Embodiment Mode 2

A light-emitting device of the present invention is not limited to the modes in which all light-emitting devices shown in FIGS. 1(A) to 1(C) have a plurality of light-emitting layers are provided between a pair of electrodes. For example, as shown in FIGS. 2(A) to 2(C), as for the second light-emitting element which exhibits emission color of light which is highly sensible to human eyes, like a greenish emission, the number of light-emitting layers included between a pair of electrodes may be smaller than that in a light-emitting element which emits a reddish emission or a bluish emission. In this manner, when an image is displayed by combining emissions from light-emitting elements each having a different luminance obtained when a predetermined current flows, the number of light-emitting layers between a pair of electrodes is made different between a light-emitting element which emits emission color of light which is less sensible to human eyes and a light-emitting element which emits emission color of light which is highly sensible to human eyes, thereby harmonizing the luminances more efficiently.

As for FIGS. 2(A) to 2(C), FIGS. 2(A) and 2(C) are identical to FIGS. 1(A) and 1(C), respectively and thus, the description thereof is omitted.

In this embodiment mode, a second light-emitting element shown in FIG. 2(B) is described. The second light-emitting element shown in FIG. 2(B) has a light-emitting layer 261 between the first electrode 251 and the second electrode 252. Such a light-emitting element operates as follows. When a voltage is applied to the first electrode 251 and the second electrode 252 such that a potential of the first electrode 251 becomes higher than a potential of the second electrode 252, holes are injected to the light-emitting layer 261 from the first electrode 251 side, and electrons are injected to the light-emitting layer 261 from the second electrode 252 side. Electrons and holes are recombined in the light-emitting layer 261 to generate excitation energy. A light-emitting substance included in the first light-emitting layer 261 is excited by the generated excitation energy and then, light is emitted when it returns to a ground state.

In the light-emitting layer 261, a light-emitting substance which can exhibit a greenish emission only or such a light-emitting substance dispersed in a substance having a larger energy gap than the light-emitting substance is included. As specific examples of a light-emitting substance, light-emitting substances exhibiting emission spectrum with peaks at 500 to 550 nm such as N,N'-dimethylquinacridon (abbreviated to DMQd); coumarin 6; coumarin 545T; and tris(8-quinolinolate)aluminum (abbreviated to Alq$_3$) can be given. In addition to the substances which emit fluorescence, substances which emit phosphorescence, such as tris(2-phenylpyridinato) iridium (III), (acetylacetonato)bis(2-phenylpyridinato)iridium(III) can be used as a light-emitting substance.

As shown in FIG. 2(B), a hole transporting layer 272 is preferably provided between the light-emitting layer 261 and the first electrode 251. In addition, an electron transporting layer 273 is preferably provided between the light-emitting layer 261 and the second electrode 252. Note that as for the mode of the electron transporting layer 273, the description of the electron transporting layer 123 described before is referred to. In addition, as for the mode of the hole transporting layer 272, the description of the hole transporting layer 122 described above is referred to.

Embodiment Mode 3

In a light-emitting device of the present invention, light emitted from light-emitting substances included in the first light-emitting layer and the second light-emitting layer may have the same color as described in Embodiment Mode 1, or may have different colors respectively. Like this, a mode of a light-emitting element in which light emission from the light-emitting substances included in the first light-emitting layer and the second light-emitting layer have different emission colors is described with reference to FIG. 3.

Figure 3:
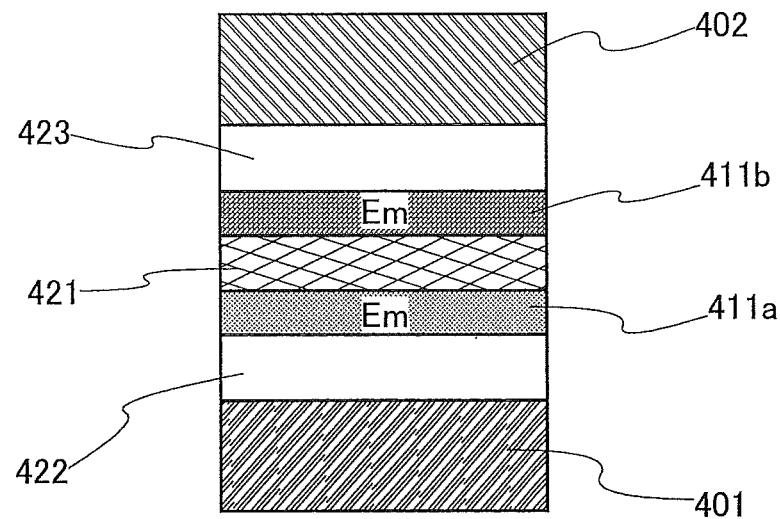
FIG. 3 is a diagram showing a mode of a light-emitting element included in a light-emitting device of the present invention.

In FIG. 3, a first light-emitting layer 411a and a second light-emitting layer 411b are provided between the first electrode 401 and the second electrode 402. There is no particular limitation on emission color of a light-emitting substance included in each of the first light-emitting layer 411a and the second light-emitting layer 411b; however, this embodiment mode describes a mode in which a light-emitting substance which emits reddish light is included in the first light-emitting layer 411a, and a light-emitting substance which emits blue-greenish light is included in the second light-emitting layer 411b.

In the first light-emitting layer 411a, a substance exhibiting emission spectrum with peaks at 600 to 680 nm can be employed: 4-dicyanomethylene-2-isopropyl-6-[2-(1,1,7,7-tetramethyljulolidin-9-yl)ethenyl]-4H-pyran (abbreviated to DCJTI); 4-dicyanomethylene-2-methyl-6-[2-(1,1,7,7-tetramethyljulolidin-9-yl)ethenyl]-4H-pyran (abbreviated to DCJT); 4-dicyanomethylene-2-tert-butyl-6-[2-(1,1,7,7-tetramethyljulolidin-9-yl)ethenyl]-4H-pyran (abbreviated to DCJTB); periflanthene; 2,5-dicyano-1,4-bis[2-(10-methoxy-1,1,7,7-tetramethyljulolidin-9-yl)ethenyl]benzene or the like is included as the light-emitting substance. In addition to the substances which emit fluorescence, substances which emit phosphorescence, such as, (acetylacetonato)bis[2-(2-benzothienyl)pyridinato]iridium(III) (abbreviated to Ir(btp)$_2$(acac)), (2,3,7,8,12,13,17,18-octaetyl-21H, 23H-porphyrinato)platinum(II) may be included as a light-emitting substance.

Note that in the first light-emitting layer 411a, a light-emitting substance only or such a light-emitting substance dispersed in a substance having a larger energy gap than the light-emitting substance is included.

In the second light-emitting layer 411b, a substance which emits a blue-greenish light is included as a light-emitting substance, such as bis(2-methyl-8-quinolinolato)(4-phenyl-phenolato)aluminum (abbreviated to BAlq), bis(2-methyl-8-quinolinolato)(4-phenylphenolato)gallium (abbreviated to BGaq), or 3,6,11,14-tetrakis(diphenylamino)dibenzo[g,p]chrysene. In addition to such substances which emit fluorescence, a substance which emits phosphorescence, such as bis{2-[3,5-bis(trifluoromethyl)phenyl]pyridinato}(picolonato)iridium(III), can be used as a light-emitting substance.

Note that in the second light-emitting layer 411b, a light-emitting substance only or such a light-emitting substance dispersed in a substance having a larger energy gap than the light-emitting substance is included.

A first layer 421 is provided between the first light-emitting layer 411a and the second light-emitting layer 411b. As for the first layer 421, the description of the first layer 121 described above is referred to.

Between the first light-emitting layer 411a and the first electrode 401, a hole transporting layer 422 may be provided as shown in FIG. 3. In addition, an electron transporting layer 423 may be provided between the second light-emitting layer 411b and the second electrode 402, as shown in FIG. 3. Note that the description of the hole transporting layer 122 and the electron transporting layer 123 is referred to as for the hole transporting layer 422 and the electron transporting layer 423 respectively.

Note also that the description of the first electrode 101 and the second electrode 102 is referred to as for the first electrode 401 and the second electrode 402 respectively.

It is be noted that either the first electrode or the second electrode 402 may be formed to have a stacked structure of a layer made of a highly reflective conductor such as aluminum, and a layer made of a conductor which can transmit visible light, such as indium tin oxide. Further, in the case of employing such a structure, by changing the thickness of the layer which can transmit visible light, an optical path in which emitted light goes may be adjusted to obtain emission with a highly color purity by utilizing the interference effect of light.

In the light-emitting device described in this embodiment mode, by the same operation of the light-emitting device described in Embodiment Mode 1, light emission from the first light-emitting layer 411a and the second light-emitting layer 411b can be obtained. Light emission form the first light-emitting layer 411a and the second light-emitting layer 411b are visible by mixing emission colors of the light emission when light is extracted from either the first electrode 401 or the second electrode 402, or from the both electrodes. As in this embodiment mode, in a case that reddish light is emitted from the first light-emitting layer 411a, and blue-greenish light is emitted from the second emitting element 411b, the light is visible as white light by mixing the colors.

Embodiment Mode 4

Although Embodiment Mode 3 is described on the mode of the light-emitting element including two light-emitting layers each exhibiting a different emission color between a pair of electrodes, the number of light-emitting layers included between a pair of electrodes may be three, for example.

One mode of a light-emitting device of the present invention is described with reference to FIG. 4.

Figure 4:
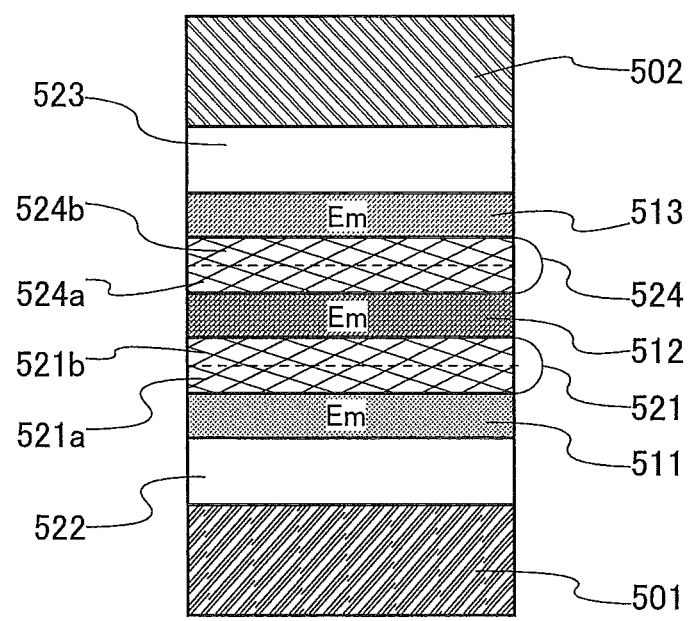
FIG. 4 is a diagram showing a mode of a light-emitting element included in a light-emitting device of the present invention.

FIG. 4 shows a light-emitting element including a first light-emitting layer 511, a second light-emitting layer 512, and a third light-emitting layer 513 between a first electrode 501 and a second electrode 502. A light-emitting substance which exhibits reddish light emission is included in the first light-emitting layer 511, a light-emitting substance which exhibits greenish light emission is included in the second light-emitting layer 512, and a light-emitting substance which exhibits bluish light emission is included in the third light-emitting layer 513. As for specific examples of a light-emitting substance which exhibits each light emission colors, the description made in Embodiment Mode 1 is referred to.

Between the first light-emitting layer 511 and the second light-emitting layer 512, a first layer 521 is provided, and between the second light-emitting layer 512 and the third light-emitting layer 513, a second layer 524 is provided. In the light-emitting element shown in this embodiment mode, the first layer 521 and the second layer 524 each serve as a charge generating layer. The first layer 521 is formed by stacking a first layer 521a and a first layer 521b. The second layer 524 is formed by stacking a second layer 524a and a second layer 524b. The first layer 521a is provided closer to the second electrode 502 than the first layer 521b. In addition, the second layer 524a is provided closer to the second electrode 502 than the second layer 524b. Each of the first layer 521a and the second layer 524a is a layer generating holes, which is includes a metal oxide and an organic matter similarly to the first layer 121a described before. As specific explanation of the first layer 521a and the second layer 524a, the description of the first layer 121a is referred to. In addition, each of the first layer 521b and the second layer 524b is a layer generating electrons, similarly to the first layer 121b described before. As specific explanation of the first layer 521b and the second layer 524b, the description of the first layer 121b is referred to.

A hole transporting layer 522 may be provided between the first light-emitting layer 511 and the first electrode 501 as shown in FIG. 4. In addition, an electron transporting layer 523 may be provided between the third light-emitting layer 513 and the second electrode 502 as shown in FIG. 4. Note that the description of the hole transporting layer 122 and the electron transporting layer 123 is referred to as for the hole transporting layer 522 and the electron transporting layer 523 respectively.

In the light-emitting element of this embodiment mode, a hole injecting layer may be provided between the hole transporting layer 522 and the first electrode 501. In addition, an electron injecting layer may be provided between the second electrode 502 and the electron transporting layer 523. Note that as for the electron injecting layer and the hole injecting layer, the description about them in Embodiment Mode 1 is referred to respectively.

In addition to those described above, a hole transporting layer, an electron transporting layer or the like may be provided appropriately.

In the light-emitting element shown in FIG. 4, when a voltage is applied such that a potential of the second electrode 502 becomes lower than a potential of the first electrode 501, holes are injected to the first light-emitting layer 511 from the first electrode 501 side, and electrons are injected to the third light-emitting layer 513 from the second electrode 502 side. The electrons are transported from the first layer 521b to the first light-emitting layer 511, and the holes are transported from the first layer 521a to the light-emitting layer 512. In addition, the electrons are transported from the second layer 524b to the second light-emitting layer 512, and the holes are transported from the second layer 524b to the third light-emitting layer 513 side. In each of the first light-emitting layer 511, the second light-emitting layer 512 and the third light-emitting layer 513, electrons and holes are recombined to generate excitation energy. A light-emitting substance is excited by the generated excitation energy, and then, light is emitted when it returns to a ground state.

Reddish light emitted from the first light-emitting layer 511, greenish light emitted from the second light-emitting layer 512 and bluish light emitted from the third light-emitting layer 513 are taken out to the outside through either or both of the first electrode 501 and the second electrode 502. These lights are mixed visually and recognized as white light.

Note that the description of the first electrode 101 and the second electrode 102 is referred to as for the first electrode 501 and the second electrode 502 respectively.

A light-emitting element described above is included in the light-emitting device of the present invention.

Embodiment Mode 5

One mode of a light-emitting device of the present invention is described with reference to FIGS. 5(A) and 5(B). FIG. 5(B) is a view showing a broken line portion of FIG. 5(A). In the light-emitting device of the present invention, a second light-emitting element 602, a third light-emitting element 603 and a fourth light-emitting element 604 are provided in addition to the first light-emitting element 601. These light-emitting elements are formed by providing a light-emitting layer between a pair of electrodes. One of the three light-emitting elements, the second light-emitting element, the third light-emitting element and the fourth light-emitting element, exhibits reddish emission, another of them exhibits greenish emission and the other of them exhibits bluish emission. Here, as one example, described is a case where the second light-emitting element is for reddish emission, the third light-emitting element is for greenish emission, and the fourth light-emitting element is for bluish emission; however, the order is not limited. In addition, each of the second light-emitting element 602, the third light-emitting element 603 and the fourth light-emitting element 604 is arranged to be adjacent with the first light-emitting element. Specifically, they are arranged as shown in FIG. 5(A).

Figures 5A, 5B:
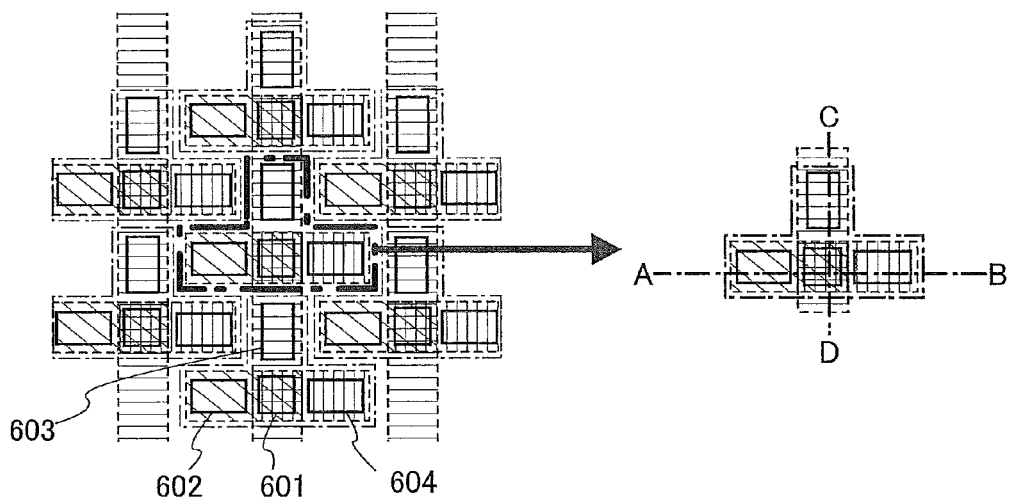
FIGS. 5(A)-5(B) are view showing a mode of light-emitting elements included in a light-emitting device of the present invention.

In FIG. 5(A), each of the first light-emitting element 601, the second light-emitting element 602, the third light-emitting element 603 and the fourth light-emitting element 604 is formed to have a square shape. However, the shape of each light-emitting element is not limited to that shown in FIG. 5(A), and for example, a circular shape may be adopted. The second light-emitting element 602 is provided on the first side of the first light-emitting element 601. The third light-emitting element 603 is provided on the second side of the first light-emitting element 601. The fourth light-emitting element 604 is provided on the third side of the first light-emitting element 601.

Figure 6A:
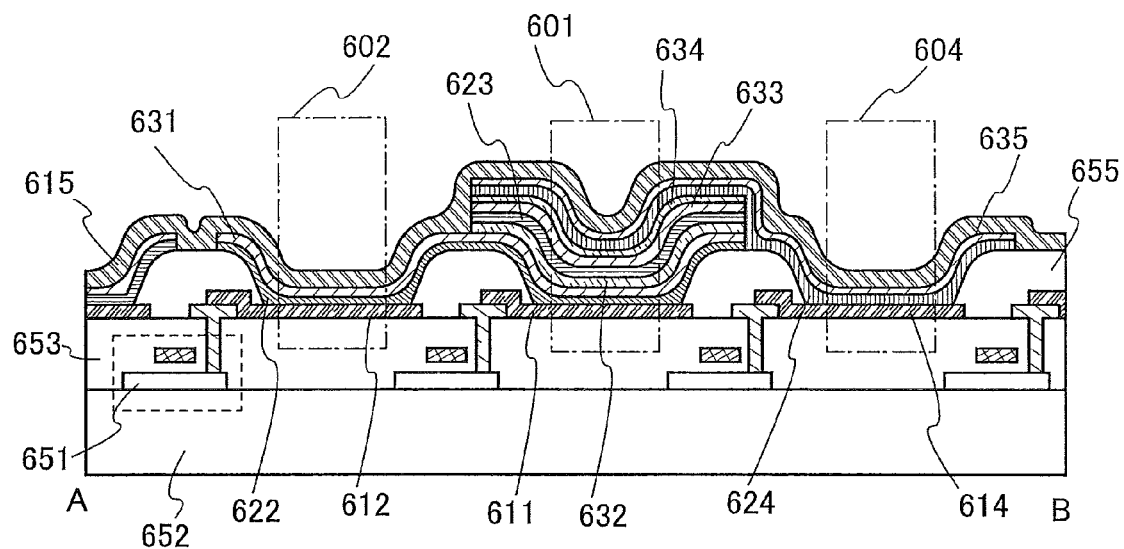
FIGS. 6(A)-6(B) are views showing modes of a light-emitting element included in a light-emitting device of the present invention.
Figure 6B:
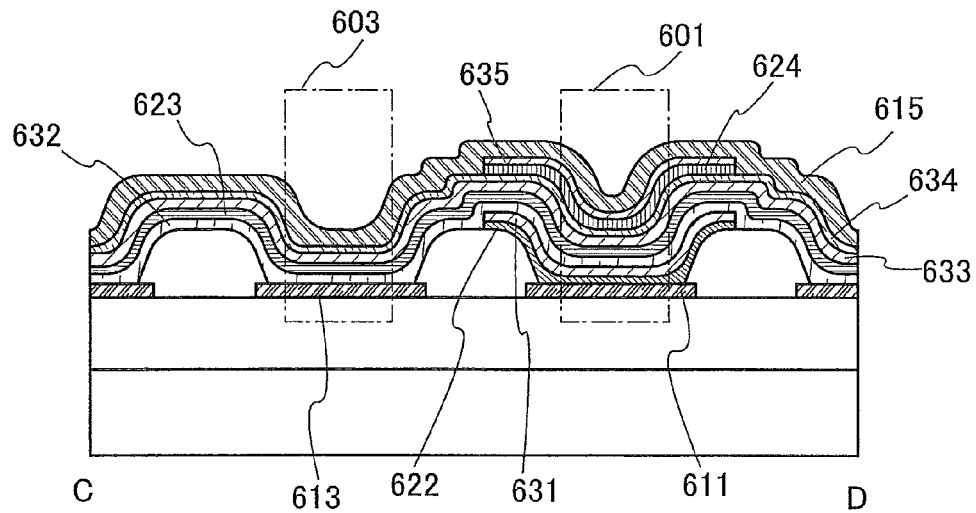

Stacked structures of these light-emitting elements are described with reference to FIGS. 6(A) and 6(B). FIG. 6(A) is a cross-sectional view of a portion taken along the broken line A-B in FIG. 5(B), and FIG. 6(B) is a cross-sectional view of a portion taken along the broken line C-D in FIG. 5. In FIG. 6(A), the first electrode 612, the first light-emitting layer 622, an electron generation layer 631, and the second electrode 615 are stacked sequentially, and by combining them in this manner, they serve as the second light-emitting element 602. In addition, the first electrode 614, the third light-emitting layer 624, and the electron generation layer 634 are stacked sequentially, and by combining them in this manner, they serve as the fourth light-emitting element 604. In FIG. 6(B), the first electrode 613, the hole generation layer 632, the second light-emitting layer 623, the electron generation layer 633, the hole generation layer 634, and the second electrode 615 are sequentially formed, and by combining them in this manner, they serve as the third light-emitting element 603. The first electrode 611, the first light-emitting layer 622, the electron generation layer 631, the hole generation layer 632, the second light-emitting layer 623, the electron generation layer 633, the hole generation layer 634, the third light-emitting layer 624, the electron generation layer 635, and the second electrode 615 are stacked sequentially. By combining them in this manner, they serve as the first light-emitting element 601.

The first light-emitting element 601, the second light-emitting element 602, the third light-emitting element 603 and the fourth light-emitting element 604 which are formed as described above, serve as one set of pixels.

Figure 7A:
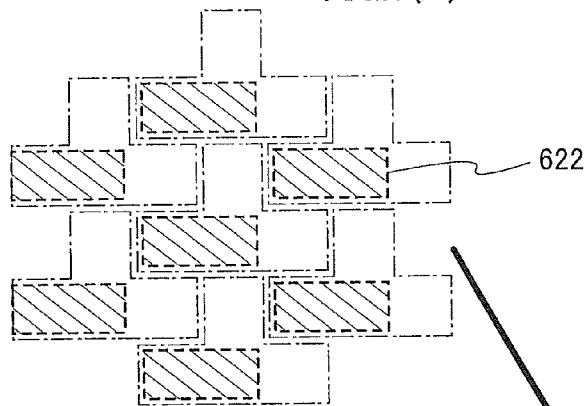
FIGS. 7(A)-7(D) are views showing a mode of light-emitting elements included in a light-emitting device of the present invention.
Figure 7B:
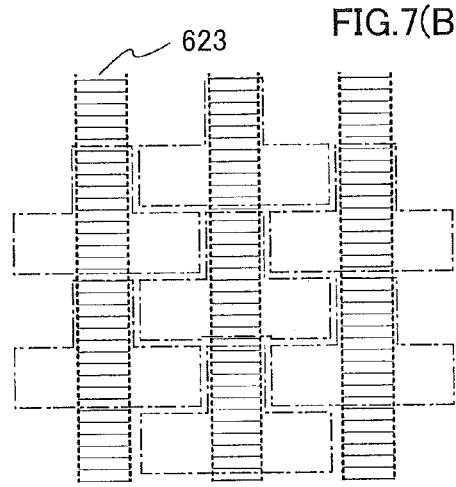
Figure 7D:
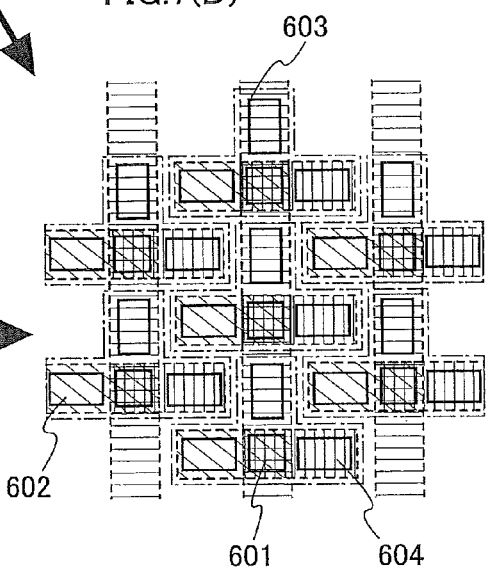
Figure 7C:
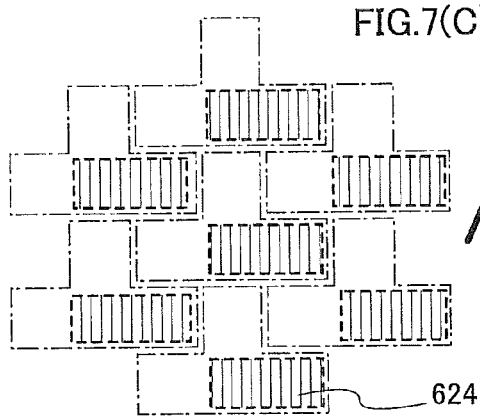

Further, in this embodiment mode, the first light-emitting layer 601 is formed to include a layer which is provided to be common with each of the second light-emitting element 602, the third light-emitting element 603 and the fourth light-emitting element 604. Top views of FIGS. 7(A) to 7(D) show how the layers exhibiting each emission color are formed. FIGS. 7(A) to 7(C) are views showing how each of the first light-emitting layer 622, the second light-emitting layer 623 and the third light-emitting layer 624 is arranged. FIG. 7(D) is a view in which FIGS. 7(A) to 7(C) are overlapped. From the FIGS. 7(A) to 7(D), it can be understood that a stacked region is provided in each of the first light-emitting layer 622, the second light-emitting layer 623 and the third light-emitting layer 624. As described above, a layer exhibiting reddish emission included in the first light-emitting layer 601 is formed at the same time when the second light-emitting element 602 is formed. A layer exhibiting greenish emission included in the first light-emitting layer 601 is formed at the same time when the third light-emitting element 603 is formed. A layer exhibiting bluish emission included in the first light-emitting layer 601 is formed at the same time when the fourth light-emitting element 604 is formed. Consequently, a light-emitting device can be manufactured with fewer steps than the case of manufacturing the first light-emitting element 601 in another step independent from the manufacturing step of the other light-emitting elements. White emission can be obtained from the first light-emitting element.

Note that in FIGS. 6(A) and 6(B), a transistor 651 which is provided to drive a light-emitting element and which is electrically connected to a light-emitting element, is also shown in addition to the light-emitting element. The transistor shown in FIG. 6(A) shows a schematic cross-sectional structure seen from a direction perpendicular to the direction of current flow. The transistor 651 is provided over a substrate 652 similarly to the light-emitting element. In addition, the light-emitting element and the transistor 651 are provided in different layers to sandwich an insulating layer 653 therebetween. End portions of the first electrodes 611, 612, 613 and 614 included in the first light-emitting element 601 to the fourth light-emitting element 604 are each covered with a partition layer 655. Note that the partition layer 655 is formed from an organic insulator or an inorganic insulator. By providing the partition layer 655, a short-circuit between electrodes of a light-emitting element caused by the influence from an electric field concentrated on the end portions of the first electrode, can be prevented.

A hole generation layer may be provided between the first electrode 611, 612 and the first light-emitting layer 622, and/or between the first electrode 614 and the third light-emitting layer 624. In addition, a hole generation layer may be provided between the electron generation layer 631 and/or 635 and the second electrode 615.

Embodiment Mode 6

In a light-emitting device of the present invention, a circuit for controlling driving of the light-emitting element may be provided, as well as each light-emitting element described in Embodiment Modes 1 to 5.

Figure 8A:
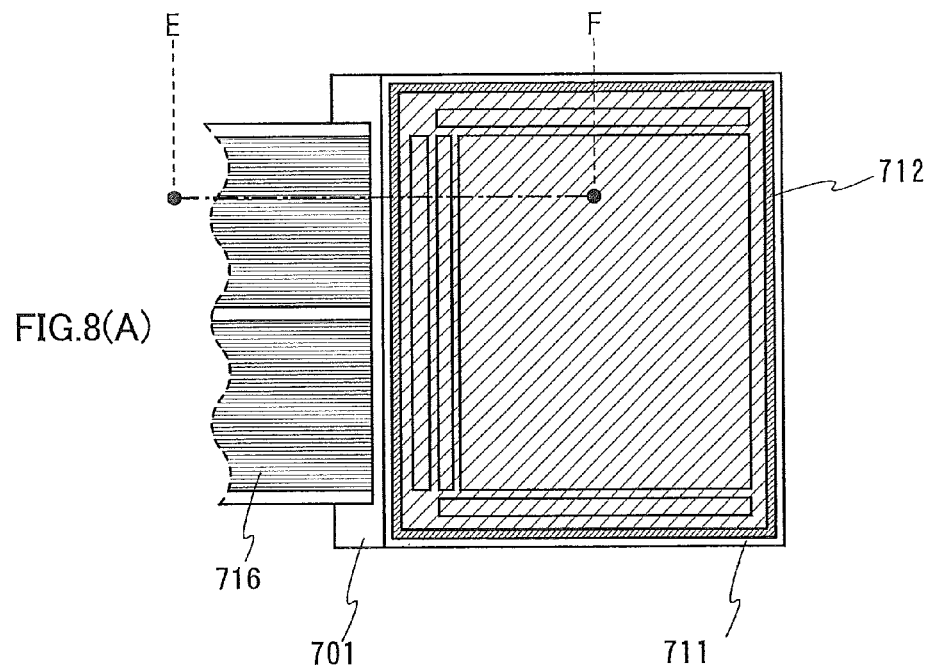
FIGS. 8(A)-8(B) are views showing a mode of a light-emitting device of the present invention.
Figure 8B:
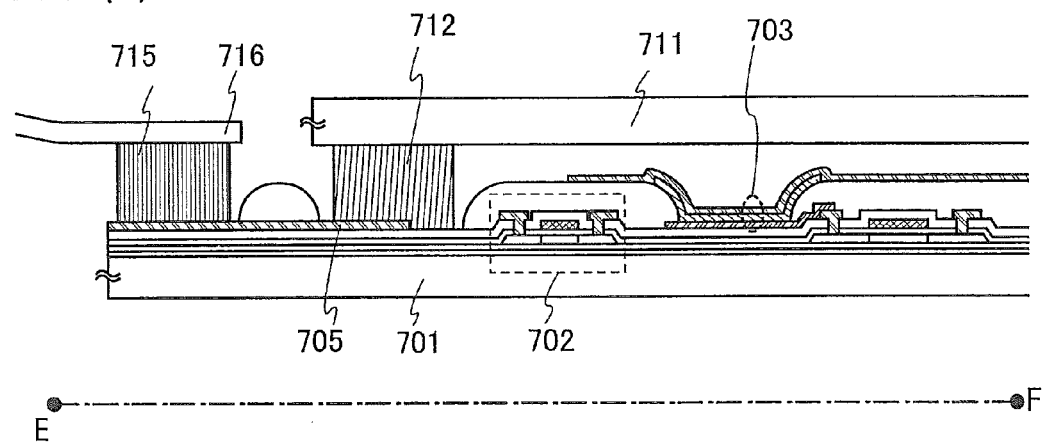

In FIGS. 8(A) and 8(B), a transistor 702, a wire and the like are provided over a substrate 701. The transistor 702 is electrically connected to the light-emitting element 703. By a signal inputted to the circuit over the substrate 701, emission/non-emission, emission time, a current value to be supplied to a light-emitting element, or the like is determined for each light-emitting element. And emission and non-emission are combined in plural light-emitting elements provided in a light-emitting device to display an image.

Figure 9:
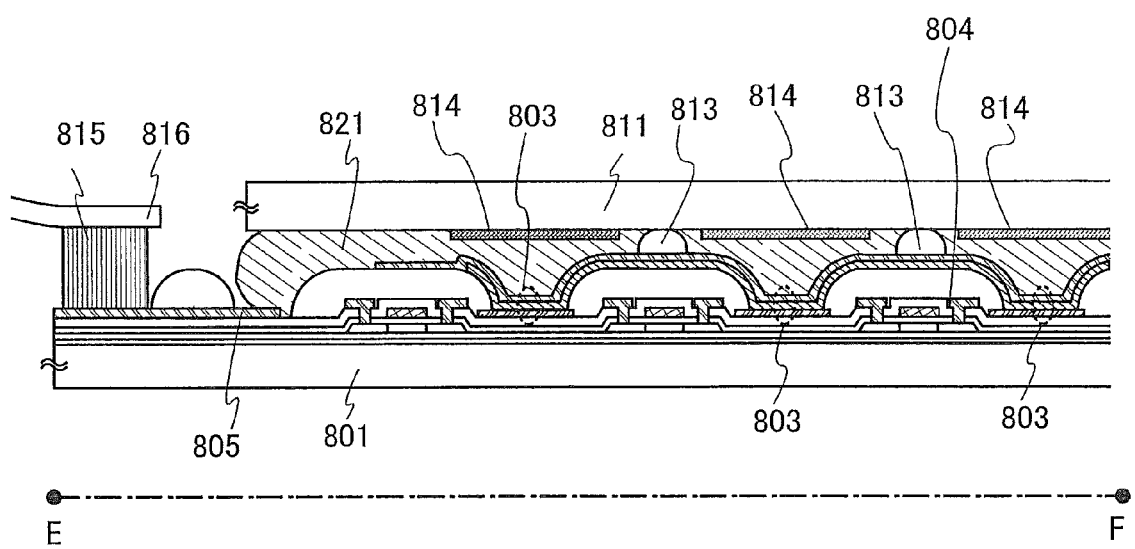
FIG. 9 is a view showing a mode of a light-emitting device of the present invention.
Figure 13A:
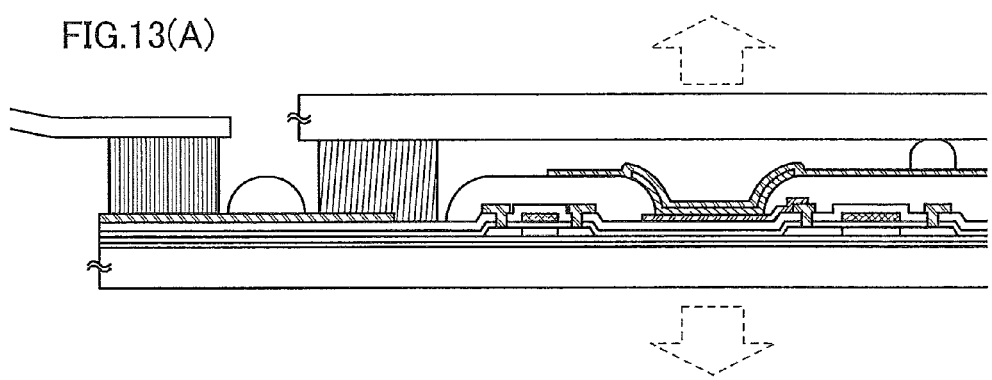
FIGS. 13(A)-13(B) are views showing modes of a light-emitting device of the present invention.

The light-emitting device is preferably sealed so as not to expose the light-emitting element to the atmosphere. There is no particular limitation on a sealing method. For example, as shown in FIG. 8, the substrate 701 and a substrate 711 are attached and sealed by a sealing material 712 such that the light-emitting element 703 is encapsulated inside. In addition, the sealed inside may be filled with a nitrogen gas or a gas such as an inert gas, or may be filled with a resin or the like. FIG. 9 shows one mode of a sealed light-emitting device in which a spacer 813 is provided over a light-emitting element and a partition layer 804 which is provided between light-emitting elements and is sealed so as not to damage the light-emitting element 803 by the contact of a substrate 811 and the light-emitting element 803. In addition, in the light-emitting device shown in FIG. 9, a filter 814 is provided to be overlapped with the light-emitting element 803. Light emitted from the light-emitting element 803 passes through the filter 814 to be colored with a desired color, and is extracted to the outside of the light-emitting device. There is no particular limitation on whether the filter 814 is provided or not. Further, in the light-emitting device shown in FIG. 9, the substrate 801 and the substrate 811 are attached by a resin 821, and the light-emitting element 803 is encapsulated so as not to be exposed to the atmosphere. Note that light may be extracted from the opposite substrates of the light-emitting device having the structure shown in FIG. 9, as shown in FIG. 13(A).

In the light-emitting device as shown in FIG. 8 or FIG. 9, a signal sent from the outside is transmitted to a circuit provided in the light-emitting device through a wire 705 or a wire 805 which is lead out from the inside of the light-emitting device to the outside of the light-emitting device. The wire 705 and the wire 805 are connected to a flexible print circuit 716 and a flexible print circuit 816 by a conductive adhesive 715 and a conductive adhesive 815, respectively.

Figure 13B:
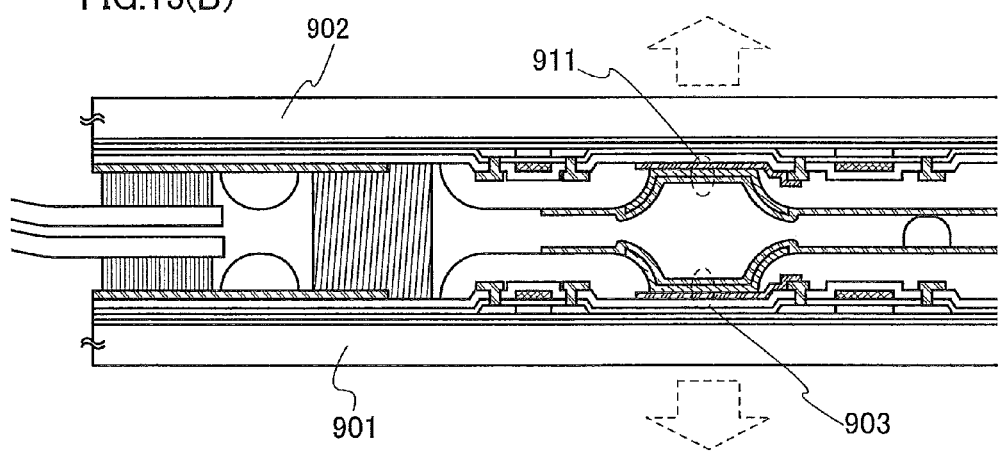

Moreover, the light-emitting device may be manufactured by attaching two substrates 901 and 902 provided with a light-emitting element and a circuit to encapsulate the light-emitting element 903 and the light-emitting element 911 provided over each substrate inside, as shown in FIG. 13B. In the light-emitting device as shown in FIG. 13, different or the same images can be taken out from the both substrates.

Embodiment Mode 7

Figure 10:
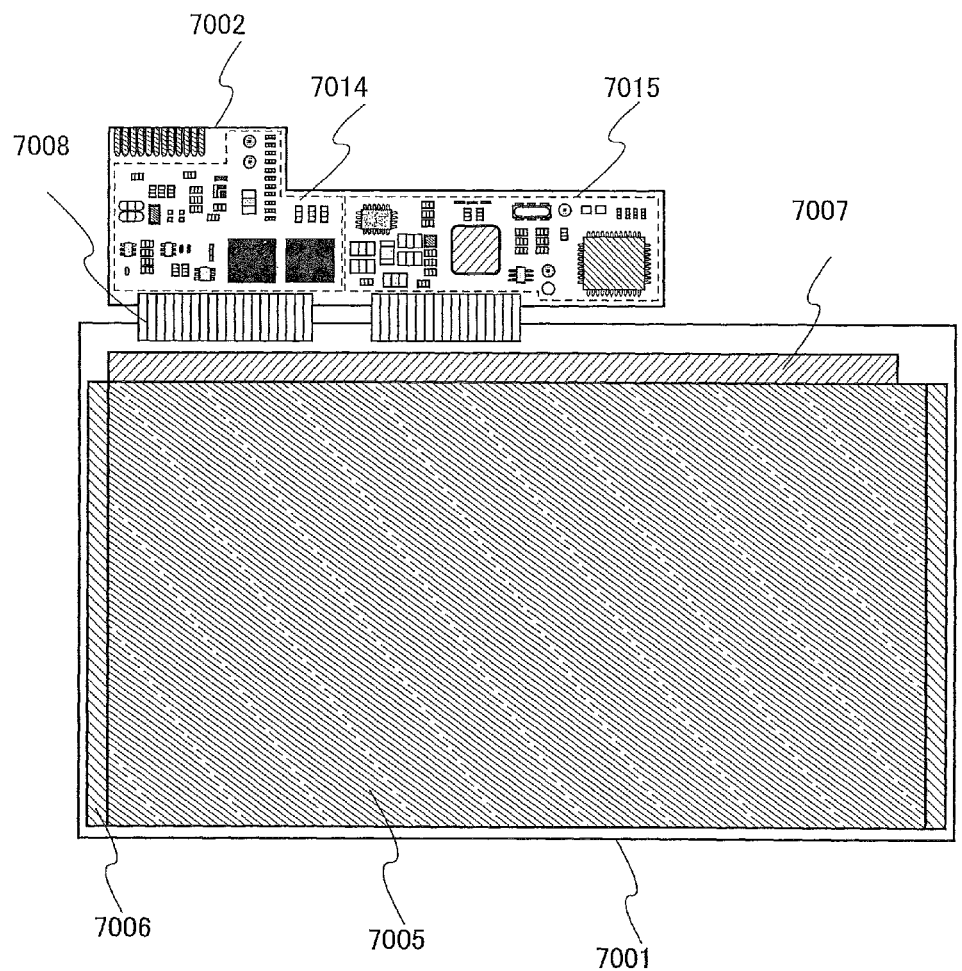
FIG. 10 is a view showing a mode of an electronic device to which the present invention is applied.

FIG. 10 shows a module in which a light-emitting device 7001 and a circuit board 7002 are combined. In the circuit board 7002, for example, a control circuit 7014, a signal division circuit 7015 or the like is provided. The light-emitting device 7001 includes at least one of light-emitting elements described in Embodiment Mode 1 to Embodiment Mode 5, and is sealed as in Embodiment Mode 6.

This light-emitting device 7001 is provided with a pixel portion 7005 in which a light-emitting element is provided in each pixel, a scanning line driver circuit 7006, and a signal line driver circuit 7007 which supplies a video signal to a selected pixel. In addition, a signal is transmitted to the light-emitting device 7001 from the circuit board 7002 through a connection wiring 7008.

Figure 11:
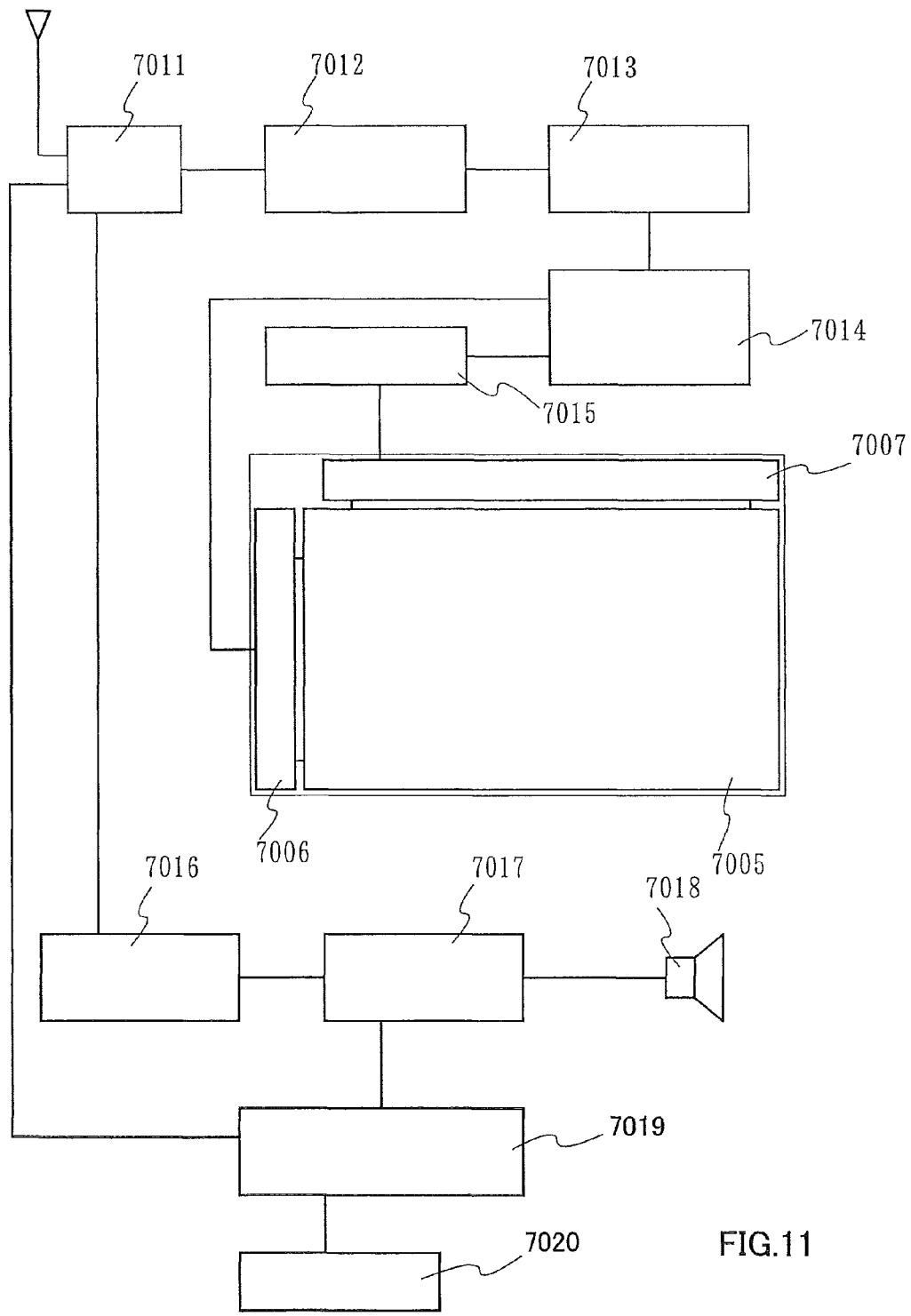
FIG. 11 is a diagram showing a mode of an electronic device to which the present invention is applied.

By mounting this module, a television image receiver can be completed. FIG. 11 is a block diagram showing a main constitution of the television image receiver. A tuner 7011 receives video signals and audio signals. The video signal is processed by a video signal amplifier circuit 7012, a video signal processing circuit 7013 that converts a signal outputted from that into a color signal corresponding to each color, and a control circuit 7014 that converts the video signal to specifications of a driver IC. The control circuit 7014 outputs a signal to each of the scan line side and the signal line side. In the case of digital driving, a signal division circuit 7015 may be provided on the signal line side, so that an inputted digital signal is divided into m signals to be supplied.

Among signals received by the tuner 7011, an audio signal is transmitted to an audio signal amplifier circuit (audio wave amplifier circuit) 7016, and an output thereof is supplied to a speaker 7018 through an audio signal processing circuit 7017. A control circuit 7019 receives control information of a receiving station (received frequency) and a sound volume from an input portion 7020, and transmits signals to the tuner 7011 and the sound signal processing circuit 7017.

Figure 12:
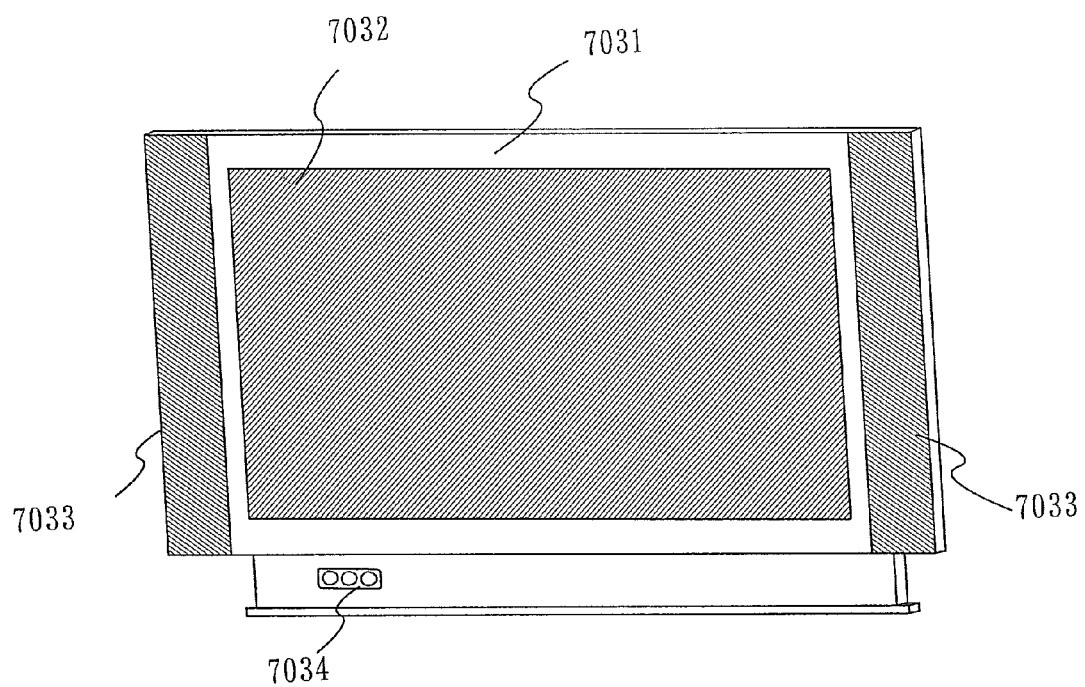
FIG. 12 is a view showing a mode of an electronic device to which the present invention is applied.

As shown in FIG. 12, a television image receiver can be completed by incorporating a module in a casing 7031. A display screen 7032 is formed using a module. within addition, a speaker 7033, an operating switch 7034 and the like is provided appropriately.

Since this television image receiver includes the light-emitting device 7001, a vivid image with excellent quality can be displayed.

As described above, a television image receiver which can provide a favorable image, can be provided by incorporating a light-emitting device of the present invention, such that it can serve as a display portion. In addition, it may be incorporated in a telephone as well as a television image receiver. Therefore, a mobile phone, a television telephone or the like which can provide a favorable image, can be completed.

Embodiment 1

Figure 15:
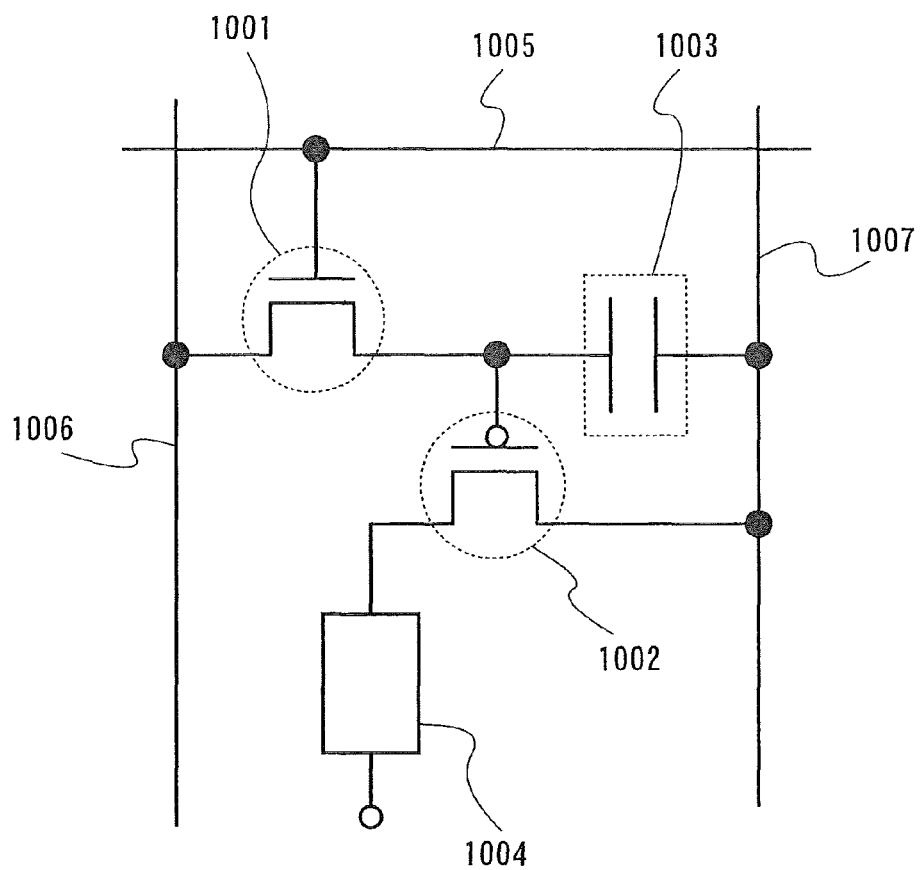
FIG. 15 is a diagram showing an example of a pixel configuration.

An example of a pixel applicable to the light-emitting devices described in Embodiment Modes 1 to 6 is shown in FIG. 15. Although only one pixel is shown here, a plurality of pixels are arranged in matrix in a row direction and a column direction in a pixel portion of the light-emitting device in reality.

A pixel has a switching transistor 1001, a driving transistor 1002, a capacitor element 1003, a light-emitting element 1004, a scanning line 1005, a signal line 1006, and a power source line 1007. A gate terminal of the switching transistor 1001 is connected to the scanning line 1005, a first terminal (a source terminal or a drain terminal) thereof is connected to the signal line 1006, and a second terminal (the source terminal or the drain terminal) thereof is connected to a gate terminal of the driving transistor 1002. Further, the second terminal of the switching transistor 1001 is connected to the power source line 1007 through the capacitor element 1003. Further, a first terminal (a source terminal or a drain terminal) of the driving transistor 1002 is connected to the power source line 1007 and a second terminal (the source terminal or the drain terminal) thereof is connected to a first electrode of the light-emitting element 1004. To a second electrode of the light-emitting element 1004, a low power source potential is set. It is to be noted that a low power source potential is, based on a high power source potential which is set to the power source line 1007, a potential satisfying the relation of the low power source potential<the high power source potential, and for example, GND, 0 V, or the like may be set as the low power source potential. Note that the capacitor element 1003 may be omitted by substituting gate capacitance of the driving transistor 1002. Note that a pixel configuration is not limited to this.

Here, a driving method of a pixel provided with the light-emitting element of the present invention is described using a voltage inputting voltage driving method and a voltage inputting current driving method as examples.

First, described is a voltage inputting voltage driving method with the pixel configuration shown in FIG. 15.

When the pixel is selected by the scanning line 1005, that is, when the switching transistor 1001 is on, a video signal is inputted from the signal line 1006 to the pixel. Then, a charge for a voltage corresponding to the video signal is accumulated in the capacitor element 1003, and the capacitor element 1003 holds the voltage. This voltage is a voltage between the gate terminal and the first terminal of the driving transistor 1002, which corresponds to a gate-source voltage Vgs of the driving transistor 1002.

Generally, an operating region of a transistor can be divided into a linear region and a saturation region. The border is when (Vgs−Vth)=Vds is satisfied where a drain-source voltage is denoted by Vds, a gate-source voltage is denoted by Vgs, and a threshold voltage is denoted by Vth. In the case of satisfying (Vgs−Vth)>Vds, the transistor operates in a linear region and a current value thereof is dependent on levels of Vds and Vgs. Meanwhile, in the case of satisfying (Vgs−Vth)<Vds, the transistor operates in a saturation region and ideally, a current value thereof hardly changes even when Vds changes. That is, the current value is determined only by the level of Vgs.

Here, in the case of the voltage inputting voltage driving method, a video signal is inputted such that Vgs of this driving transistor 1002 becomes two states of sufficiently turning on and turning off the driving transistor 1002. That is, the driving transistor 1002 is operated in a linear region.

Therefore, in the case of a video signal of turning on the driving transistor 1002, ideally, a power source potential Vdd which has been set to the power source line 1007 can be set to the first electrode of the light-emitting element 1004 as it is.

That is, ideally, a voltage applied to the light-emitting element 1004 is made constant so that the luminance obtained from the light-emitting element 1004 becomes constant. Then, a plurality of subframe periods are provided in one frame period, a writing of a video signal to a pixel is performed per subframe period to control light emission/non-light emission of the pixel per subframe period, so that gradation is expressed depending on the total of a subframe period in which light emission is performed.

On the other hand, in a voltage inputting current driving method, the driving transistor 1002 is operated in a saturation region.

Then, depending on a value of Vgs of the driving transistor 1002, a current value flowing to the driving transistor 1002 is determined. That is, based on a video signal inputted to the capacitor element 1003 from the signal line 1006, the luminance of the light-emitting element 1004 is determined to express gradation.

Here, in the case where a light-emitting device performs a full-color display which is composed of color elements of R (red), G (green), and B (blue), an applied voltage or an applied current to a light-emitting element in order to obtain a required luminance for the light-emitting element is different for respective pixels of the color elements of R, G, and B. Described next is, thus, a method of changing a voltage applied to a light-emitting element per pixel of each color element. In particular, as described in Embodiment Modes 1 to 5, an applied voltage required for a pixel having a light-emitting element including two light-emitting layers is high since it is necessary to apply a voltage to each of the two light-emitting layers.

First, description is made on the case of the voltage inputting voltage driving method. In order to change an applied voltage to the light-emitting element 1004 for respective pixels of the color elements, a potential which is set to the power source line 1007 for each color element may be changed. In addition, in the case of changing the potential which is set to the power source line 1007 for each color element, the driving transistor 1002 may be turned on/off sufficiently. That is, in the case of increasing a potential of the power source line 1007 connected to the first terminal which is a source terminal of the driving transistor 1002, a gate potential required for turning on the driving transistor 1002 sufficiently (a video signal of L level) may be higher by the potential increase of the power source line 1007 while a gate potential required for turning off the driving transistor 1002 sufficiently (a signal of H level) is required to be higher by the potential increase of the power source line 1007. That is, when the potential of the power source line 1007 is increased, respective potentials of H level and L level of a video signal required for turning on/off the driving transistor 1002 become higher by that. Note that the signal of L level is not necessarily increased because operation can be performed even if the signal of L level remains low. On the other hand, as for a video signal of a pixel of a color element in the case of decreasing the potential of the power source line 1007, respective potentials of H level and L level of the video signal required for turning on/off the driving transistor 1002 become lower by that. Note that the signal of H level is not necessarily decreased because operation can be performed even if the signal of H level remains high.

Figure 16:
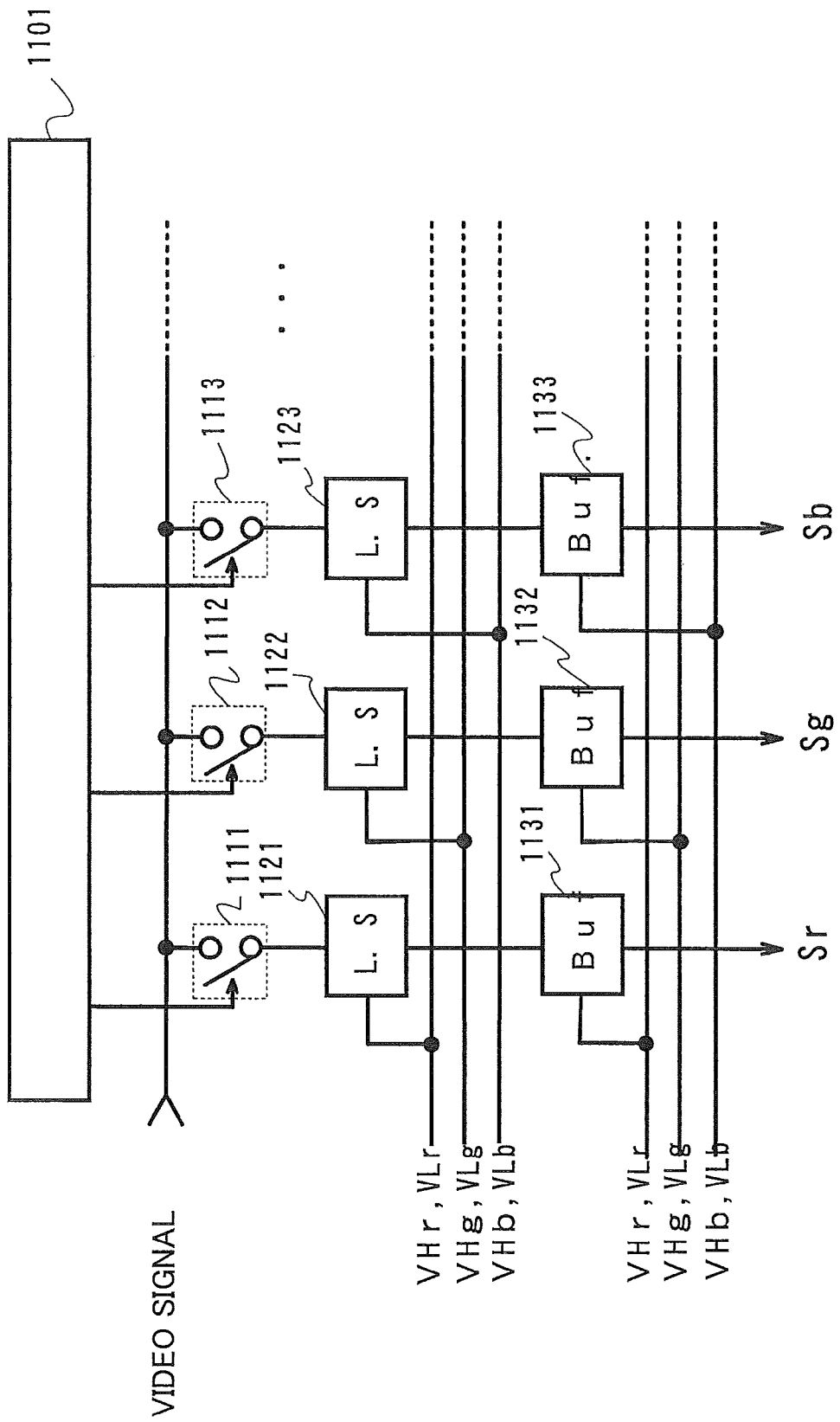
FIG. 16 is a schematic diagram of a signal line driver circuit described in Embodiment 1.

Next, shown in FIG. 16 is a signal line driver circuit for shifting the level of a video signal per color element of the pixels. A video signal outputted from this signal line driver circuit is written into the pixel, and in accordance with the video signal, on/off of the driving transistor 1002 which controls on/off of the light-emitting element 1004 is controlled.

By a sampling pulse outputted from a pulse output circuit 1101, a switch (one of a switch 1111, a switch 1112, a switch 1113, and the like) provided in a signal line (one of Sr, Sg, Sb, and the like) for each column of the pixels is turned on sequentially. Then, through the switch which is turned on, the video signal is inputted to a level shifter (one of a level shifter 1121, a level shifter 1122, a level shifter 1123, and the like). That is, when the switch 1111 is turned on, the video signal is inputted to the level shifter 1121, when the switch 1112 is turned on, the video signal is inputted to the level shifter 1122, and when the switch 1113 is turned on, the video signal is inputted to the level shifter 1123.

It is to be noted that a latch circuit may be provided between the level shifter and the video signal line. One latch circuit may be provided or a plurality (for example, two) of latch circuits may be provided per signal line (Sr, Sg, Sb, or the like).

Then, in the case where the video signal is inputted to the level shifter 1121, the level of the signal is set such that H level of the video signal is VHr and L level thereof is VLr. This level may be set based on a potential of the power source line 1007 of a pixel of a color element R. For example, in the case where the light-emitting element 1004 of the pixel of the color element R includes two or more light-emitting layers and a required applied voltage is large, the potential of the power source line 1007 is made high and the level of the video signal is also shifted to be high. On the other hand, in the case where the required applied voltage the light-emitting element 1004 of the pixel of the color element R is low, the potential of the power source line 1007 is made low and the level of the video signal is also shifted to be low. Note here that being high or low of the required applied voltage of the light-emitting element 1004 means whether it is higher or lower as compared to the light-emitting element 1004 of a pixel of another color element.

Meanwhile, in the case where the video signal is inputted to the level shifter 1122, the level of the signal is set such that H level of the video signal is VHg and L level thereof is VLg. In addition, in the case where the video signal is inputted to the level shifter 1123, the level of the signal is set such that H level of the video signal is VHb and L level thereof is VLb.

The video signal of which the level is shifted by the level shifter 1121 is inputted to a buffer 1131, and the current supply capability is increased by the buffer 1131 to be outputted to the signal line Sr. The buffer outputs a signal having about the same potential as the signal inputted thereto. The signal line Sr corresponds to the signal line 1006 of the pixel in FIG. 15. Similarly, the video signal of which the level is shifted by the level shifter 1122 is inputted to a buffer 1132, and the current supply capability is increased by the buffer 1132 to be outputted to the signal line Sg. The video signal of which the level is shifted by the level shifter 1123 is inputted to a buffer 1133, and the current supply capability is increased by the buffer 1133 to be outputted to the signal line Sb.

In this manner, the video signals of which the levels are set per color element of R, G, or B are written into pixels of a selected row. Note that through the signal line Sr, the signal is inputted to the pixel of a color element of R. Through the signal lines Sg and Sb, the signals are inputted to the pixels of color elements of G and B respectively.

In this manner, the video signal is inputted to the pixels of the selected row sequentially through the signal line of a column of which the switch is turned on.

In the case where the size (a lighting period or the like) of a video signal is corrected in order to change an applied voltage of the light-emitting element for respective pixels of the color elements, gamma correction may also be performed; a gamma value is stored in a memory means in advance to form a table. Then, the video signal is corrected in accordance with the gamma value.

Noted that, in the voltage inputting voltage driving method, when one frame period is divided into a plurality of subframes to express gradation (a digital time gray scale method), the frame frequency becomes high since a large number of gray scale levels are expressed. Therefore, in the case of expressing the large number of gray scale levels, display with the large number of gray scale levels can be performed while suppressing increase of the frame frequency, by combining an area gray scale method and the digital time gray scale method. For example, for expressing 1024 gray scale levels, five sub-pixels are arranged in one pixel in which they have the area ratio of $2^0$, $2^1$, $2^2$, $2^3$, and $2^4$, and one frame is divided into five subframes having the ratio of $2^0$, $2^1$, $2^2$, $2^3$, and $2^4$. Then, by combining them, 1024 gray scale levels can be expressed; that is, the sub-pixel having the smallest area may be emitted light during the shortest subframe period in the case of gradation of the least significant bit. On the other hand, in the case of gradation of the most significant bit, all the sub-pixels within one pixel may be emitted light in all the subframes.

Figure 17:
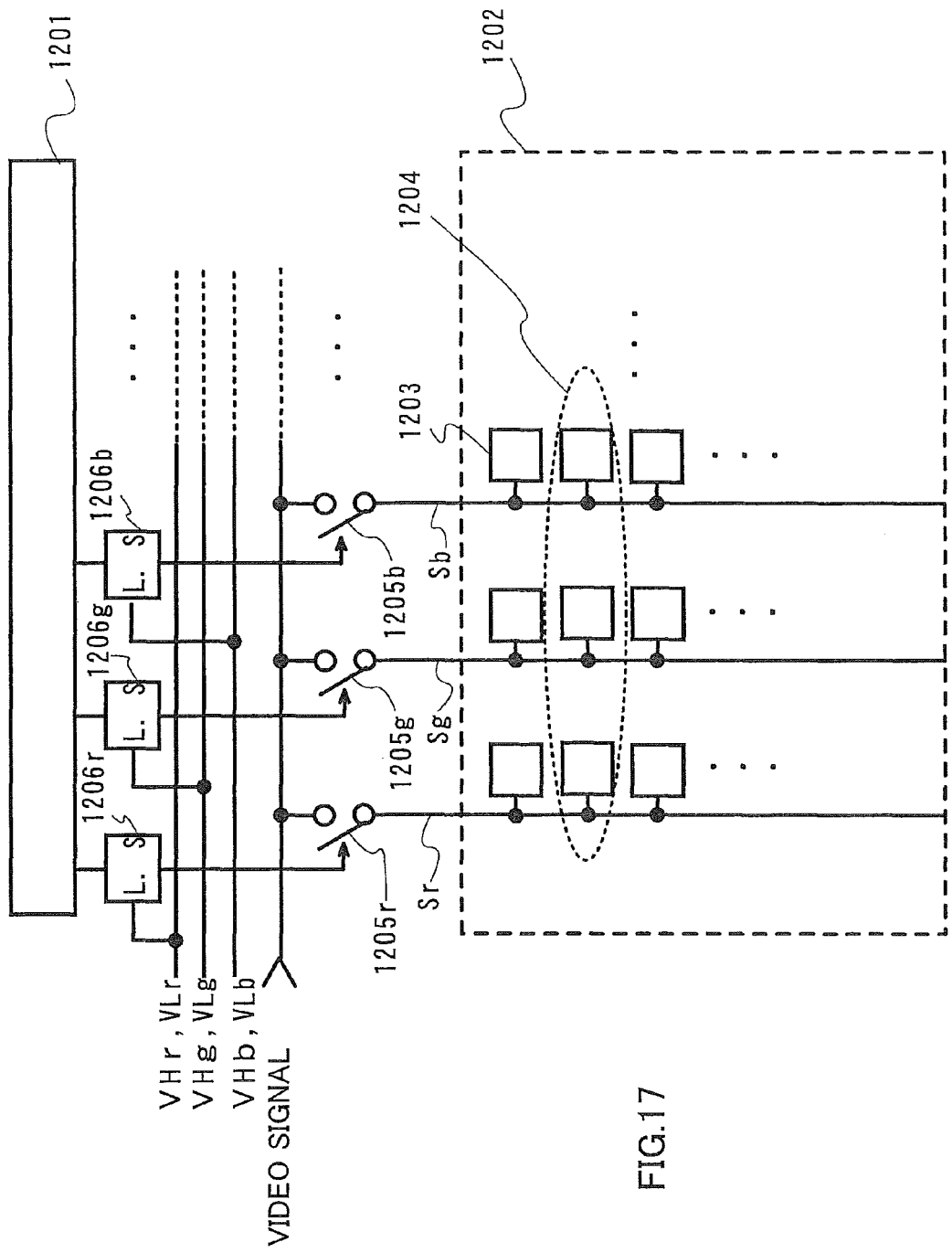
FIG. 17 is a schematic diagram of a light-emitting device described in Embodiment 1.

Next, description is made on the case of the voltage inputting current driving method with reference to FIG. 17. A schematic diagram of a light-emitting device with the voltage inputting current driving method is shown in in FIG. 17. The light-emitting device includes a pulse output circuit 1201 and a pixel portion 1202. In the pixel portion 1202, a plurality of pixels 1203 are arranged in matrix. Note that the pixel shown in FIG. 15 can apply to the pixel 1203.

By a sampling pulse outputted from the pulse output circuit, a switch (one of 1205r, 1205g, 1205b, and the like) provided in a signal line (one of Sr, Sg, Sb, and the like) for each column of the pixels is turned on sequentially. Then, through the switch which is turned on, the video signal is inputted to the signal line for each column of the pixels 1203. That is, when the switch 1205r is turned on, the video signal is inputted to the signal line Sr, when the switch 1205g is turned on, the video signal is inputted to the signal line Sg, and when the switch 1205b is turned on, the video signal is inputted to the signal line Sb. Then, the signal is written into pixels of a selected row. Note that through the signal line Sr, the signal is inputted to the pixel of a color element of R. Through the signal lines Sg and Sb, the signal is inputted to the pixels of color elements of G and B respectively.

In this manner, the video signal is inputted to the pixels of the selected row sequentially through the signal line of a column of which the switch is turned on.

In the case of the voltage inputting current driving method, a voltage value corresponding to this video signal is different depending on the gray scale level of the pixel. Note that a potential is set to the signal line when inputting a voltage.

Therefore, a potential of the video signal is corrected depending on pixels for each color element. That is, even in a case of a video signal at the same gray scale level, the potential may be changed depending on each color element of R, G, and B. When a required applied current of the light-emitting element is large, the potential of the video signal is made lower than a video signal at the same gray scale level of another color element. Thus, a current flowing into the driving transistor is increased. That is, a current flowing into the light-emitting element is increased.

Here, described is a method of shifting a potential of the video signal at each gray scale level depending on each color element. Note that described in this embodiment mode is a method of shifting the video signal at each gray scale level depending on each color element, using a digital-analog conversion circuit.

Figure 23:
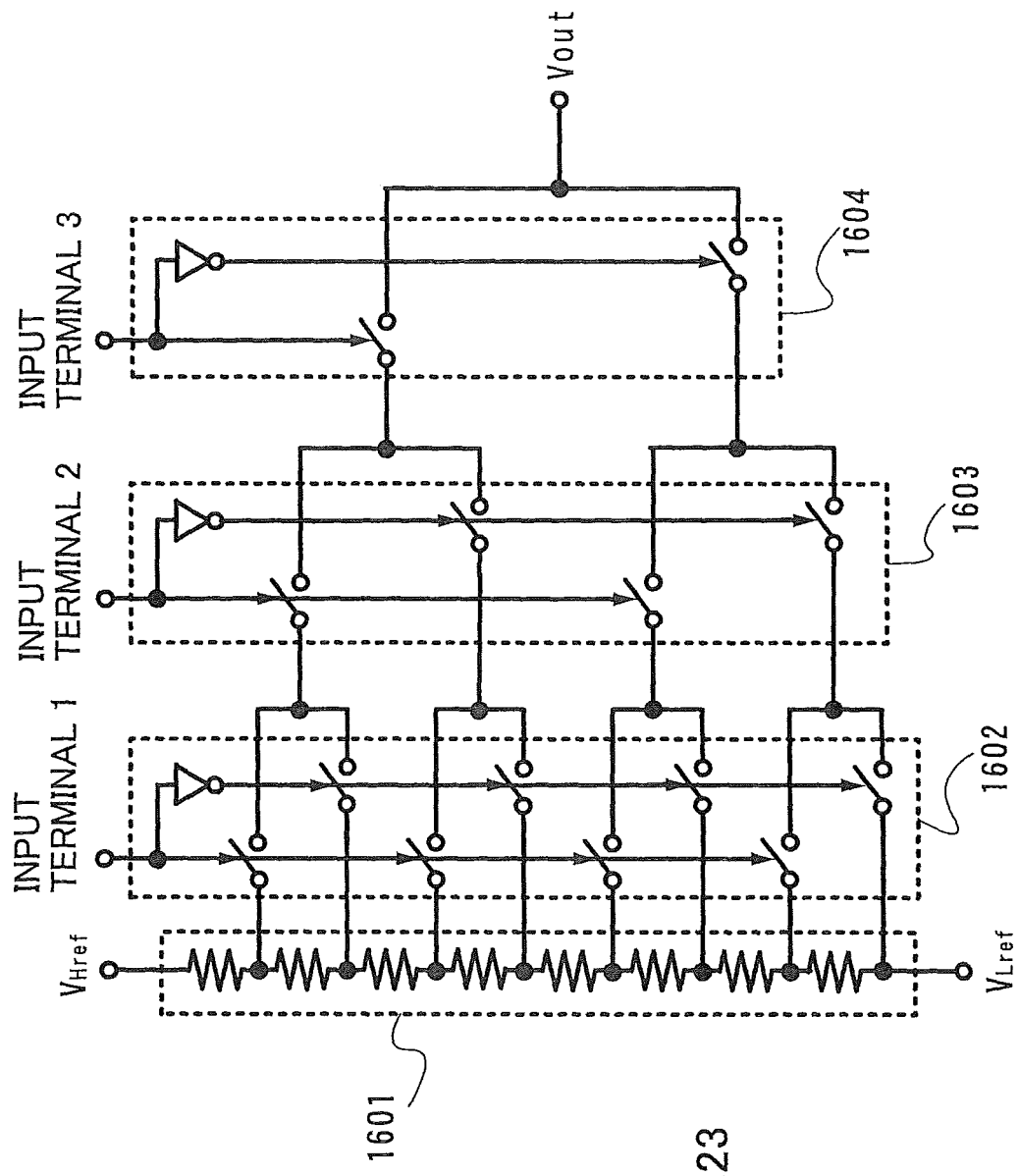
FIG. 23 is a diagram showing a digital-analog conversion circuit.

FIG. 23 shows a resistor string digital-analog conversion circuit with 8 gray scale levels (a 3-bit).

A resistor element group 1601 in which resistors are connected in series, a first switch group 1602, a second switch group 1603, and a third switch group 1604 are included.

A high reference power source potential $V_{Href}$ is set to one terminal of the resistor element group 1601 and a low reference power source potential $V_{Lref}$ is set to the other terminal thereof. Into an input terminal 3 which is an input terminal of the third switch group 1604, a signal of the third bit is inputted to select one of a group of gray scale levels 0 to 3 and a group of gray scale levels of 4 to 7. Into an input terminal 2 which is an input terminal of the second switch group 1603, a signal of the second bit is inputted to select one of a group of gray scale levels 0, 1, 4, and 5 or a group of gray scale levels of 2, 3, 6, and 7. Into an input terminal 1 which is an input terminal of the first switch group 1602, a signal of the first bit is inputted to select one of a group of gray scale levels 0, 2, 4, and 6 or a group of gray scale levels of 1, 3, 5, and 7. In this manner, a video signal corresponding to the gray scale level belonging to all the groups selected in the first switch group 1602, the second switch group 1603, and the third switch group 1604, is outputted from an output terminal $V_{OUT}$.

Note that a potential outputted from the output terminal $V_{OUT}$ is outputted as a potential by resistance-dividing a potential difference between the high reference power source potential $V_{Href}$ and the low reference power source potential $V_{Lref}$ which are set to the terminals of the resistor element group in which connection is performed in series, depending on the number of gray scale levels.

Therefore, in this embodiment, a value of the reference power source potential which is set to the digital-analog conversion circuit is changed for each color element of RGB. That is, when a video signal which is to be inputted to a pixel of the color element of which an applied voltage required for a light-emitting element is high is converted into an analog signal, a value of the low reference power source potential $V_{Lref}$ of the digital-analog conversion circuit is made lower than the low reference power source potential of the other color elements. On the contrary, when a video signal which is to be inputted to a pixel of the color element of which an applied voltage required for a light-emitting element is low is converted into an analog signal, a value of the low reference power source potential $V_{Lref}$ of the digital-analog conversion circuit is made higher than the low reference power source potential of the other color elements.

In addition, in the case where an N-channel type transistor is adopted as the driving transistor, when a video signal which is to be inputted to a pixel of the color element of which an applied voltage required for a light-emitting element is high is converted into an analog signal, a value of the high reference power source potential $V_{Href}$ of the digital-analog conversion circuit is made higher than the high reference power source potential of the other color elements. On the contrary, when a video signal which is to be inputted to a pixel of the color element of which an applied voltage required for a light-emitting element is low is converted into an analog signal, a value of the high reference power source potential $V_{Href}$ of the digital-analog conversion circuit is made lower than the high reference power source potential of the other color elements.

In this manner, the video signal can be corrected for each color element.

In the case where the voltage value of a video signal is corrected in order to change an applied voltage of the light-emitting element for respective pixels of the color elements, gamma correction may also be performed; a gamma value is stored in a memory means in advance to form a table. Then, the video signal is corrected in accordance with the gamma value.

It is to be noted that a "switch" described in this embodiment or the like is not limited particularly, such as an electrical switch or a mechanical switch, as long as it can control as current flow. For example, a transistor, a diode, a logic circuit combining them, or the like may be used. Therefore, in the case of using a transistor as a switch, polarity (conductivity) thereof is not particularly limited because it operates just as a switch. However, when an off current is preferred to be small, a transistor with a polarity with a small off current is favorably used. For example, the transistor which has an LDD region has a small off current. Further, it is desirable that an n-channel type transistor be employed when a potential of a source terminal of the transistor as a switch is closer to the potential of a low potential side power source (Vss, Vgnd, 0 V or the like), and a p-channel type transistor be employed when the potential of the source terminal is closer to the potential of a high potential side power source (Vdd or the like). This is because it can be easily operated as a switch since an absolute value of the gate-source voltage can be increased. Note also that a CMOS type switch may be used as well by using both n-channel and p-channel type transistors.

As described above, the video signal is an analog value. In addition, in the case of a pixel of which a light-emitting element includes two or more light-emitting layers, a required voltage value of a video signal is high. Therefore, a signal which becomes a sampling pulse from the pulse output circuit, for controlling on/off of the switch 1205*r*, the switch 1205*g*, and the switch 1205*b* in order to set an analog value to the signal lines (Sr, Sg, and Sb), may be changed by a level shifter 1206*r*, a level shifter 1206*g*, and a level shifter 1206*b*. That is, in the case where a transistor is used as the switch 1205*r*, the switch 1205*g*, and the switch 1205*b*, the transistors functioning as the switch 1205*r*, the switch 1205*g*, and the switch 1205*b* for selecting pixels to be written a video signal are easily operated in a linear region even if a value of a video signal is largely different for respective pixels of the color elements.

That is, in the case where a P-channel type transistor is used as the driving transistor of the pixel 1203, if an applied potential required for the light-emitting element is higher as compared to pixels of the other color elements, a potential of a video signal is required to be lower than a potential of a video signal at the same gray scale level of the pixels of the other color elements. Consequently, a potential of a source terminal of the transistor functioning as the switch (the 1205r, the 1205g, the 1205b, or the like) for controlling supply of the video signal to the signal line becomes largely different per color element of a pixel connected to the signal line. Note that in order to input an analog video signal into a pixel, a drain terminal of the transistor functioning as the switch for controlling supply of the video signal to the signal line is connected to a pixel side.

Here, in order to operate the transistor as a switch, it is required that Vgs<Vth is satisfied when the switch is off whereas both Vgs>Vth and Vds<Vgs−Vth are satisfied when the switch is on. Note that Vgs is a gate-source voltage of a transistor, Vds is a drain-source voltage of the transistor, and Vth is a threshold voltage of the transistor.

Accordingly, in the case where a potential of the source terminal of the transistor as the switch for controlling supply of the video signal to the signal line is largely different per color element of pixels, a level of the sampling pulse which is inputted to the gate terminal thereof is also preferably changed per color element of a pixel connected to the signal line.

Figure 18:
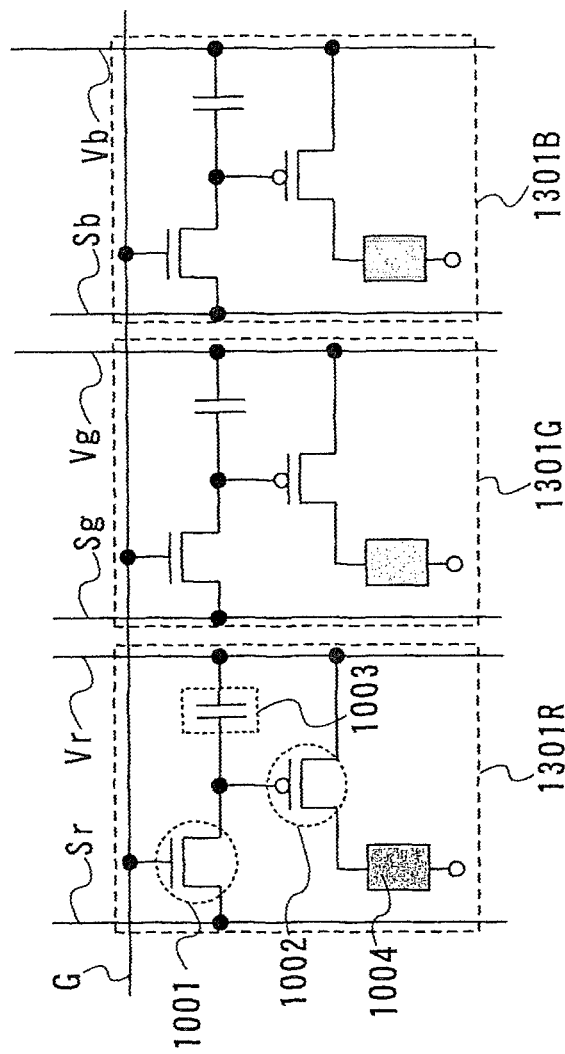
FIG. 18 is a diagram showing a pixel configuration of a light-emitting device described in Embodiment 1.

Moreover, not only the potential of the video signal but also a potential of the power source line may be changed per color element. An example of a pixel configuration denoted by a dotted line 1204 is shown in FIG. 18. The common reference numerals are used for the common portions of FIG. 15. In the pixel configuration in FIG. 18, signal lines Sr, Sg, and Sb are correspond to those in FIG. 17 respectively. In addition, as a power source line corresponding to the power source line 1007 in FIG. 15, power source lines Vr, Vg, and Vb are provided for a pixel 1301R of a color element R, a pixel 1301G of a color element G, and a pixel 1301B of a color element B respectively. In addition, the scanning line 1005 shown in FIG. 15 corresponds to a scanning line Gi in FIG. 18.

It is to be noted that in the case where the potential of the power source line is changed such as the power source lines Vr, Vg, and Vb, the level of the potential of the video signal for making a pixel emit no-light is also changed. For example, when the potential of the power source line Vr of a pixel of a color element R is increased, the potential of a source terminal of the driving transistor 1002 is correspondingly increased, therefore, the potential of a video signal of H level required for turning off the driving transistor 1002 is also increased. That can be similarly applied to respective elements of the color elements of G and B.

Note that a second electrode of the light-emitting element 1004 shown in FIG. 18 is a common electrode to respective pixels of the color elements of RGB. Therefore, in the case where a common potential is set to the power source lines Vr, Vg, and Vb which are provided for respective pixels of the color elements of RGB, and a voltage to be applied to the light-emitting element 1004 for respective pixels of the color elements of RGB is controlled only by a video signal, there occurs the following problem if the difference of the applied voltage required for the light-emitting element 1004 is large.

That is, in a pixel where the applied voltage required for the light-emitting element 1004 is small, the drain-source voltage of the driving transistor 1002 becomes large so that the speed of deteriorating the driving transistor 1002 becomes fast. On the other hand, in a pixel where the applied voltage required for the light-emitting element 1004 is large, the drain-source voltage of the driving transistor 1002 becomes too small so that the operation is performed in the linear region.

Figure 24:
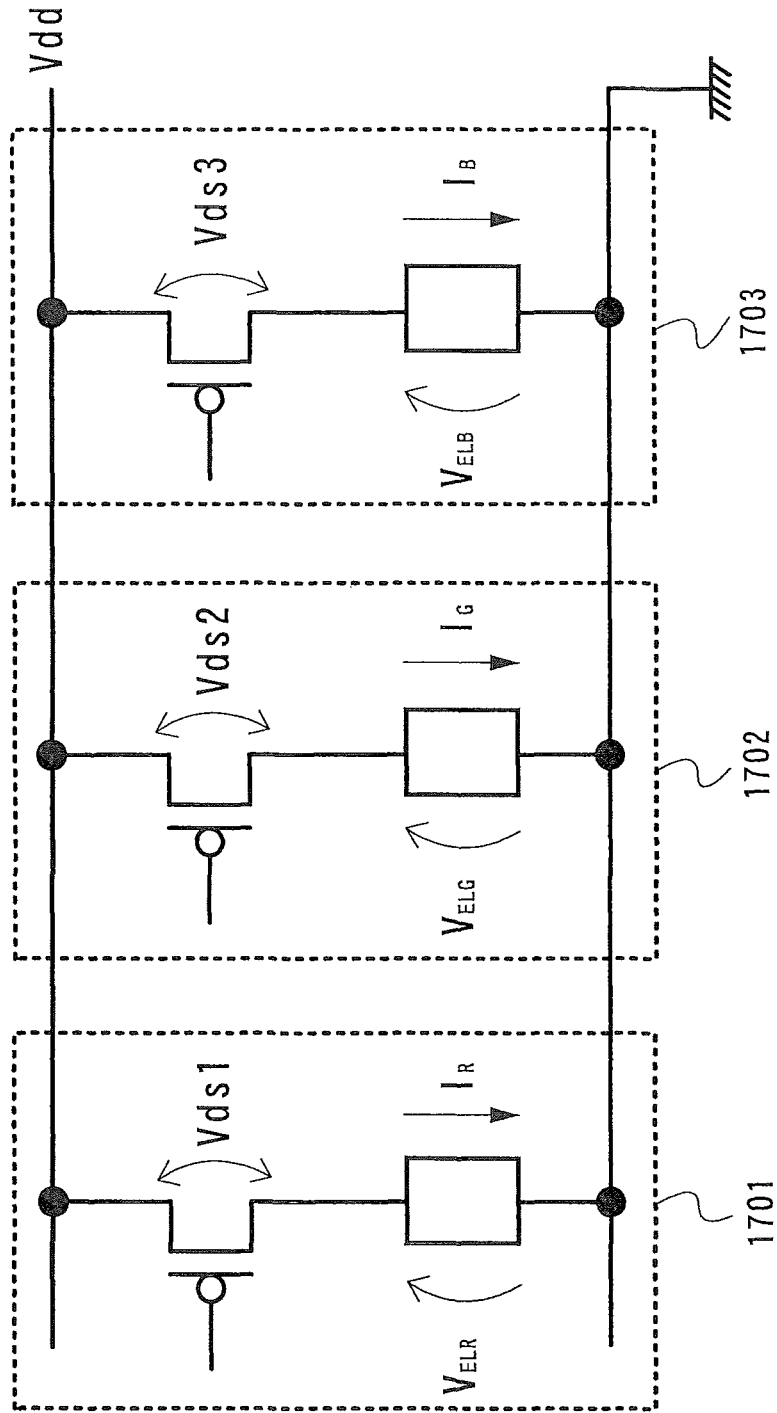
FIG. 24 is a schematic diagram of pixels in the case where a power source potential of a power source line of a pixel for each color element is common.

Details thereof are described below with reference to FIG. 24. FIG. 24 is a schematic diagram of respective elements of color elements of RGB. A pixel 1701 is a pixel of the color element of R, a pixel 1702 is a pixel of the color element of G, and a pixel 1703 is a pixel of the color element of B.

Each of the pixel 1701, the pixel 1702, and the pixel 1703 includes a driving transistor and a light-emitting element. A drain-source voltage of the driving transistor of the pixel 1701 is denoted by $V_{ds1}$, an applied voltage of the light-emitting element thereof is $V_{ELR}$, and an applied current of the same is $I_R$, a drain-source voltage of the driving transistor of the pixel 1702 is denoted by $V_{ds2}$, an applied voltage of the light-emitting element thereof is $V_{ELG}$, and an applied current of the same is $I_G$, and a drain-source voltage of the driving transistor of the pixel 1703 is denoted by $V_{ds3}$, an applied voltage of the light-emitting element thereof is $V_{ELB}$, and an applied current of the same is $I_B$.

It is assumed here that a large voltage is required as the applied voltage $V_{ELR}$ whereas a small voltage is required as the applied voltage $V_{ELB}$. That is, the required applied voltages satisfy the relation of $V_{ELR} \gg V_{ELG} \gg V_{ELB}$. Thus, in the case of setting the applied voltage to the light-emitting element as described above only by a video signal, respective drain-source voltages of the driving transistors becomes $V_{ds1} \ll V_{ds2} \ll V_{ds3}$ since a high power source potential Vdd and a low power source potential are common among respective pixels of the color elements.

Consequently, the drain-source voltage $V_{ds3}$ of the driving transistor of the pixel of the color element of B becomes too large. Accordingly, the transistor is destroyed.

Meanwhile, the drain-source voltage $V_{ds1}$ of the driving transistor of the pixel of the color element of R becomes too small. Accordingly, the driving transistor is operated in the linear region.

Therefore, it is found that a power source potential is preferably set for each color element of potentials of RGB, in order to solve the problem.

Accordingly, in this embodiment, a video signal is inputted to the signal lines Sr, Sg, and Sb by being corrected arbitrarily for respective pixels of the color elements, even in the case of the pixels at the same gray scale level. In addition, by setting a high power source potential to the power source lines Vr, Vg, and Vb for respective pixels of the color elements, an applied voltage of the light-emitting element 1004 for obtaining the luminance suitable for respective pixels of the color elements can be easily set.

Note that the second electrode of the light-emitting element 1004 may be changed for each color as well.

In addition, described in this embodiment is the method in which the level of the video signal for each gray scale level is shifted by changing the high reference power source potential or the low reference power source potential with the resistor string digital-analog conversion circuit (R-DAC); however, both the high reference power source potential and the low reference power source potential may be changed to shift the level of the video signal for each gray scale level as well. In addition, in stead of the resistor string digital-analog conversion circuit, a capacitor array digital conversion circuit (C-DAC) may be used, or the capacitor array digital conversion circuit and the resistor string digital conversion circuit may be used in combination as well. In that case also, the potential of the video signal for each gray scale level can be shifted depending on respective pixels of the color elements by changing the reference power source potential arbitrarily.

Note that the description is made on the case of a dot sequential method as for the writing from the signal line to the pixel in this embodiment; however, a line sequential method may be of course employed as well in which video signals for one row are latched and the latched video signals are written all at once to pixels for one row.

In addition, the description is made on the case of adopting a P-channel type transistor as the driving transistor in this embodiment; however, an N-channel type transistor may be of course adopted as well. In that case, respective levels of the video signal for making the pixel emit light and emit no-light are inverted. That is, the pixel emits light in the case of H level whereas emits no-light in the case of L level.

Embodiment 2

Figure 19:
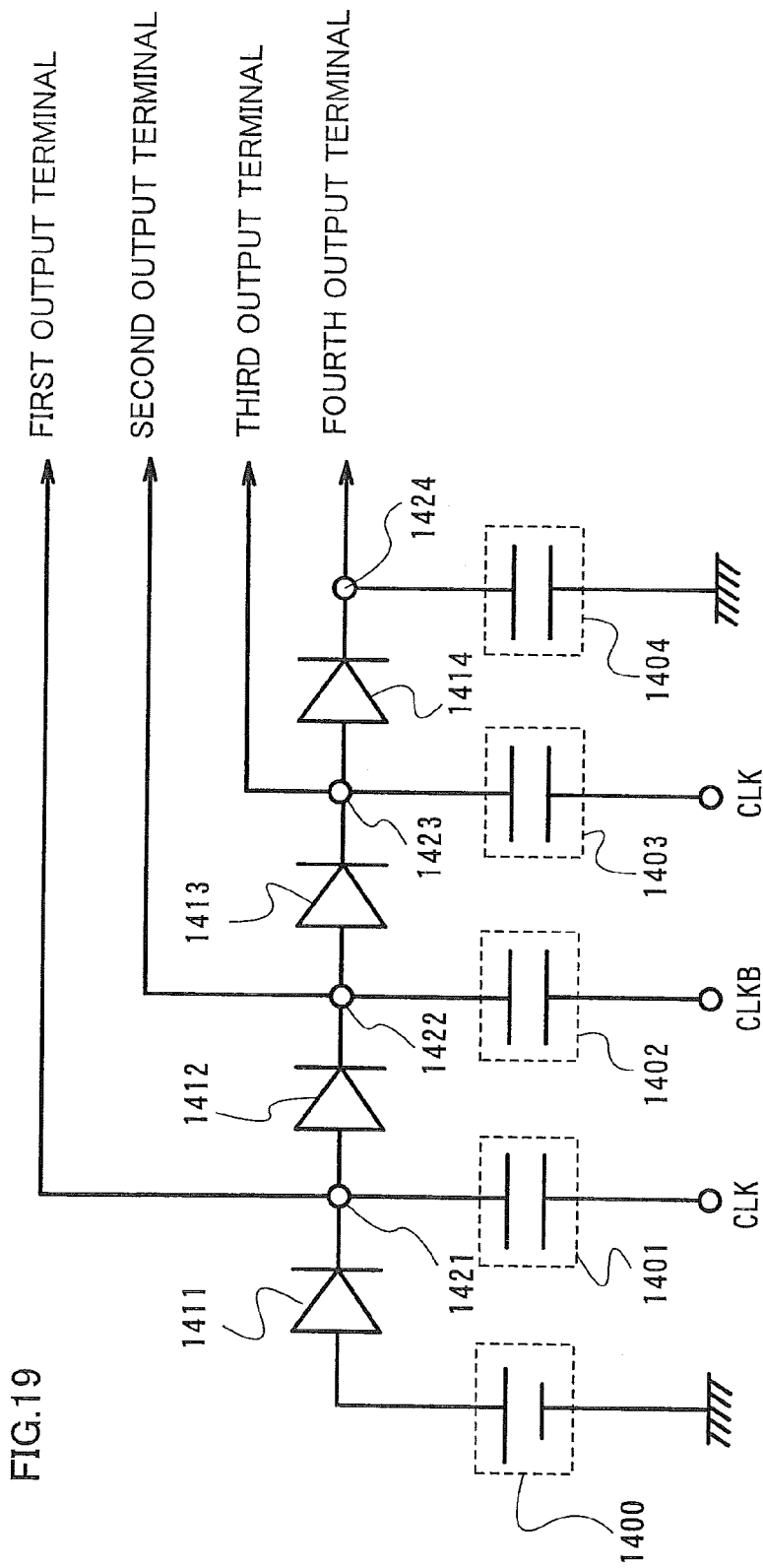
FIG. 19 is a diagram showing a voltage step-up circuit.

A circuit for generating different high power source potentials is described with reference to FIG. 19 in this embodiment. In this embodiment, a voltage step-up circuit, so-called a charge pump is used.

A constant voltage source 1400 for supplying a voltage of Vref; a capacitor element 1401, a capacitor element 1402, a capacitor element 1403, a capacitor element 1404, a rectifying element 1411, a rectifying element 1412, a rectifying element 1413, and a rectifying element 1414 are included. The rectifying element 1411, the rectifying element 1412, the rectifying element 1413, and the rectifying element 1414 are connected in series, and an input terminal of the rectifying element 1411 is connected to a high potential side of the constant voltage source 1400. Then, a low potential side of the constant voltage source 1400 is connected to GND. An output terminal of the rectifying element 1411 is connected to an input terminal of the rectifying element 1412 at an intersection point 1421, an output terminal of the rectifying element 1412 is connected to an input terminal of the rectifying element 1413 at an intersection point 1422, and an output terminal of the rectifying element 1413 is connected to an input terminal of the rectifying element 1414 at an intersection point 1423. In addition, a first electrode of the capacitor element 1401 is connected to the intersection point 1421, and a clock signal (CLK) is inputted to a second electrode thereof. In addition, a first electrode of the capacitor element 1402 is connected to the intersection point 1422, and a clock inverted signal (CLKB) is inputted to a second electrode thereof. In addition, a first electrode of the capacitor element 1403 is connected to the intersection point 1423, and a clock signal (CLK) is inputted to a second electrode thereof. In addition, a first electrode of the capacitor element 1404 is connected to an output terminal 1424 of the rectifying element 1414, a second electrode thereof is connected to GND. Note that another predetermined potential may be inputted to the second electrode of the capacitor element 1404 as well.

Note that the intersection point 1421 is a first output terminal, the intersection point 1422 is a second output terminal, the intersection point 1423 is a third output terminal, and the output terminal 1424 of the rectifying element 1414 is a fourth output terminal.

Here, in the case where the L level of the clock signal (CLK) and the clock inverted signal (CLKB) is GND and the H level thereof is v, by inputting the clock signal and the clock inverted signal continuously, a charge is accumulated in the capacitor elements 1401, 1402, 1403, and 1404 so that the potential of the intersection point 1421 becomes the potential of Vref and a potential of Vref+v alternately.

Consequently, the potential of Vref or the potential of Vref+v, the potential of Vref+2 v or the potential of Vref+v, and the potential of Vref+2 v or the potential of Vref+3 v can be obtained from the first output terminal, the second output terminal, and the third output terminal respectively. Note that the potential of Vref+3 v can be obtained from the fourth output terminal.

Therefore, an arbitrarily potential may be obtained by the potential obtained from each of the first to fourth output terminals, through a stabilized power source circuit (regulator). A potential of Vref+v or less, a potential of Vref+2 v or less, and a potential of Vref+3 v or less can be obtained from the first output terminal, the second output terminal, and the third output terminal and the fourth output terminal respectively. Therefore, for example, arbitrarily potentials in the range of Vref to Vref+v, in the range of Vref+v to Vref+2 v, in the range of Vref+2 v to Vref+3 v, and in the range of Vref+2 v to Vref+3 v are preferably obtained from the first output terminal, the second output terminal, the third output terminal, and the fourth output terminal respectively.

It is to be noted that the clock pulse (CLK) or the clock inverted pulse (CLKB) which is inputted to the second electrodes of the capacitor elements 1401, 1402, and 1403, or the like is not necessarily inputted all of the time, and for example, it may be stopped being inputted when the potential of the fourth output terminal becomes a certain potential.

Figure 25:
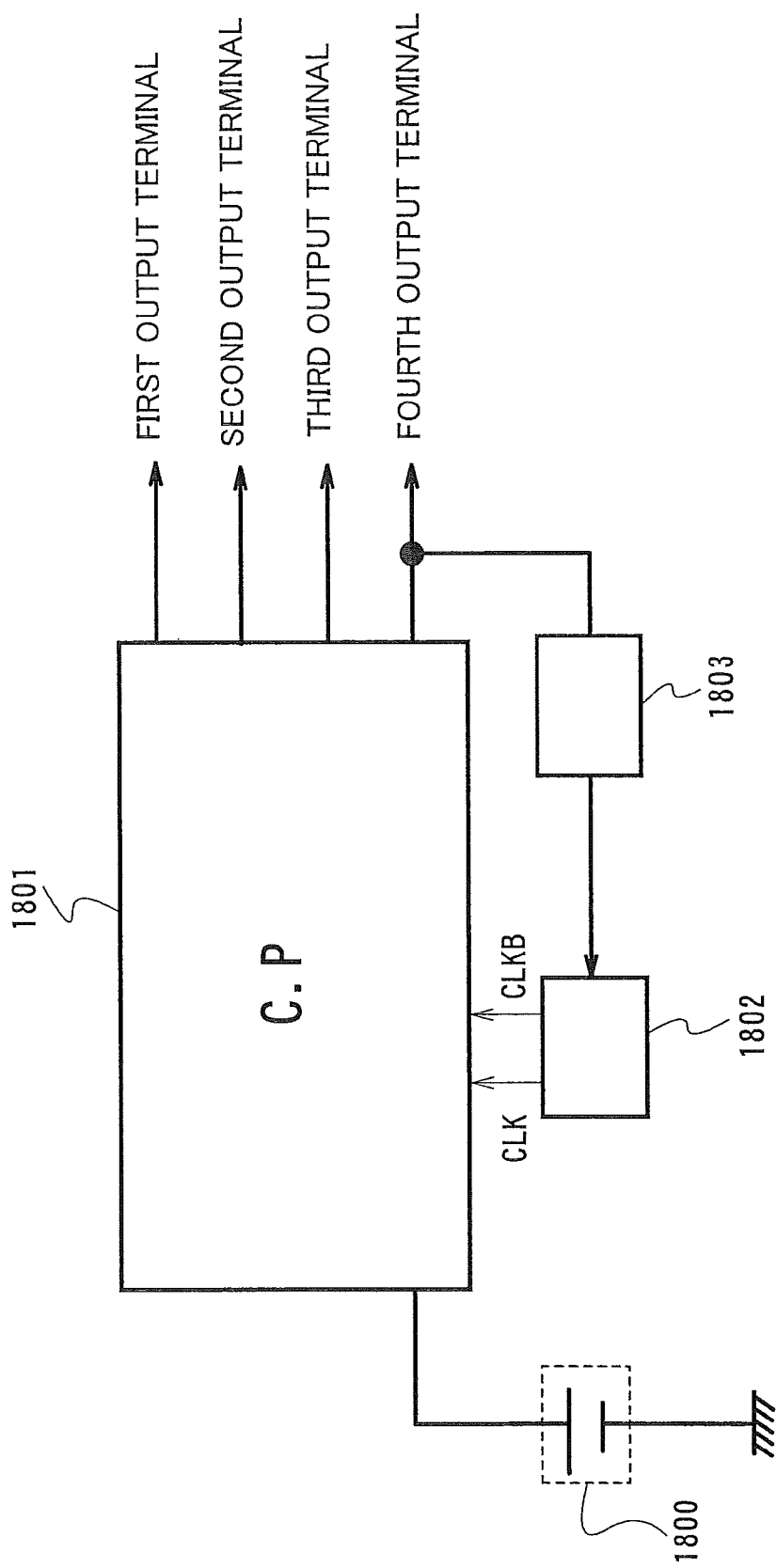
FIG. 25 is a schematic diagram of a voltage step-up circuit.
Figure 26:
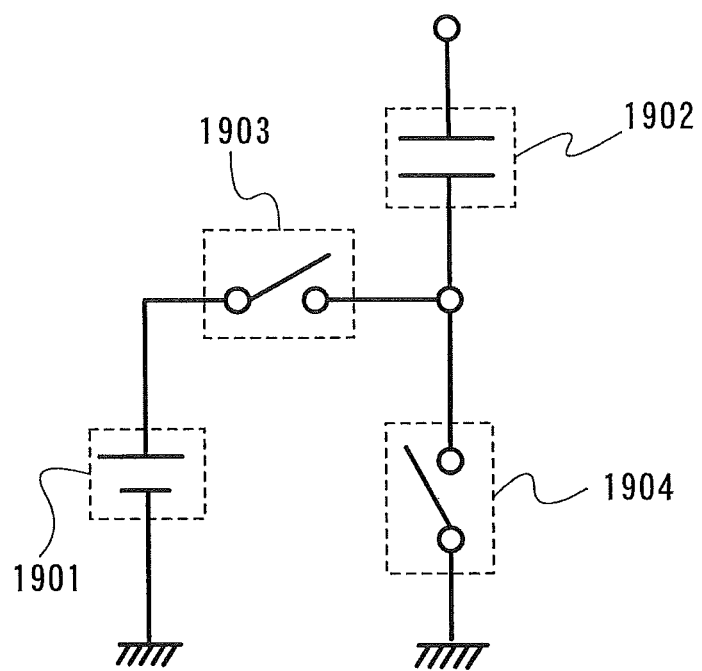
FIG. 26 is a circuit diagram having a function of a clock pulse.

A structure in the case where inputting of the clock pulse (CLK) or the clock inverted pulse (CLKB) is stopped when a condition is satisfied is described with reference to a simple schematic diagram shown in FIG. 25.

The potential of Vref is supplied to an input terminal of a charge pump 1801 from a constant voltage source 1800, so that different potentials can be obtained from the first to fourth output terminals respectively. Here, a potential detecting circuit 1803 detects the potential of the fourth output terminal which obtains the output from the rectifying element at the farthest point, and outputs a control signal when the potential becomes a certain potential so that the clock pulse (CLK) or the clock inverted pulse (CLKB) is stopped being inputted from a clock pulse generating circuit 1802.

Next, a structure for using each potential obtained from the first output terminal to the fourth output terminal as a stabilized power source is described.

Figure 20:
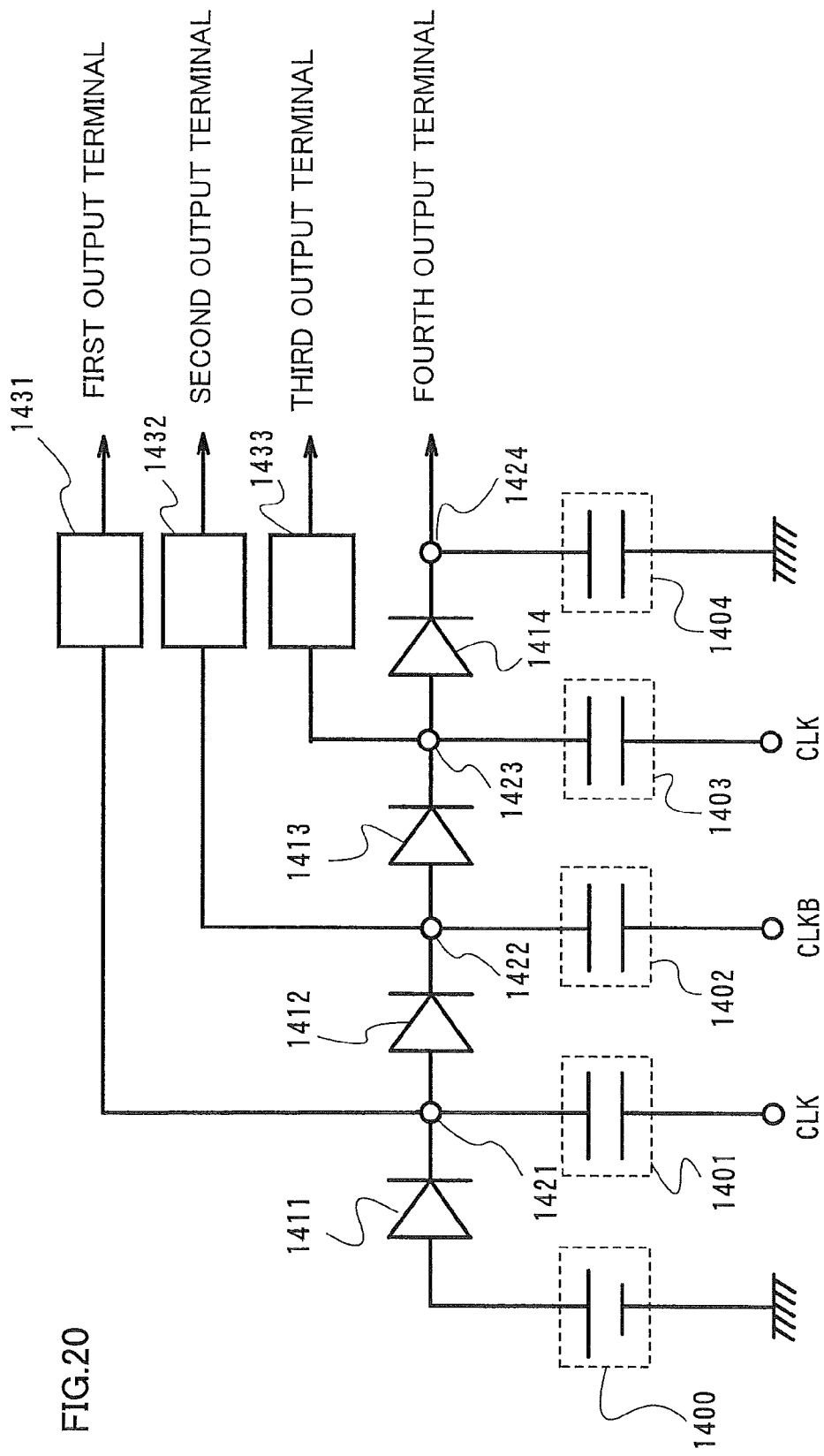
FIG. 20 is a diagram showing a voltage step-up circuit.

Shown in FIG. 20 is a structure to which a stabilized power source for supplying four power source potentials can be applied. The common reference numerals are used for the common structures of FIG. 19. In the structure shown in FIG. 20, potentials obtained from the intersection point 1421, the intersection point 1422, and the intersection point 1423 are made to be constant potentials by a stabilized power source circuit 1431, a stabilized power source circuit 1432, and a stabilized power source circuit 1433 respectively. In addition, In order to make the potential of the output terminal 1424 of the rectifying element 1414 constant, the capacitor element 1404 with large electrostatic capacitance is used. As a result, since a charge capable of being stored becomes large, the fluctuation of the potential can be suppressed.

Accordingly, respective potentials obtained from the output terminals 1 to 4 can be stabilized.

In addition, before obtaining the output from the output terminal, one electrode of a capacitor with large capacitance for accumulating the output is connected through a rectifying element, and the other element thereof is connected to GND. Then, an output may be obtained from the one electrode side of the capacitor element. Accordingly, the fluctuation of the output potential can be suppressed.

Figure 21:
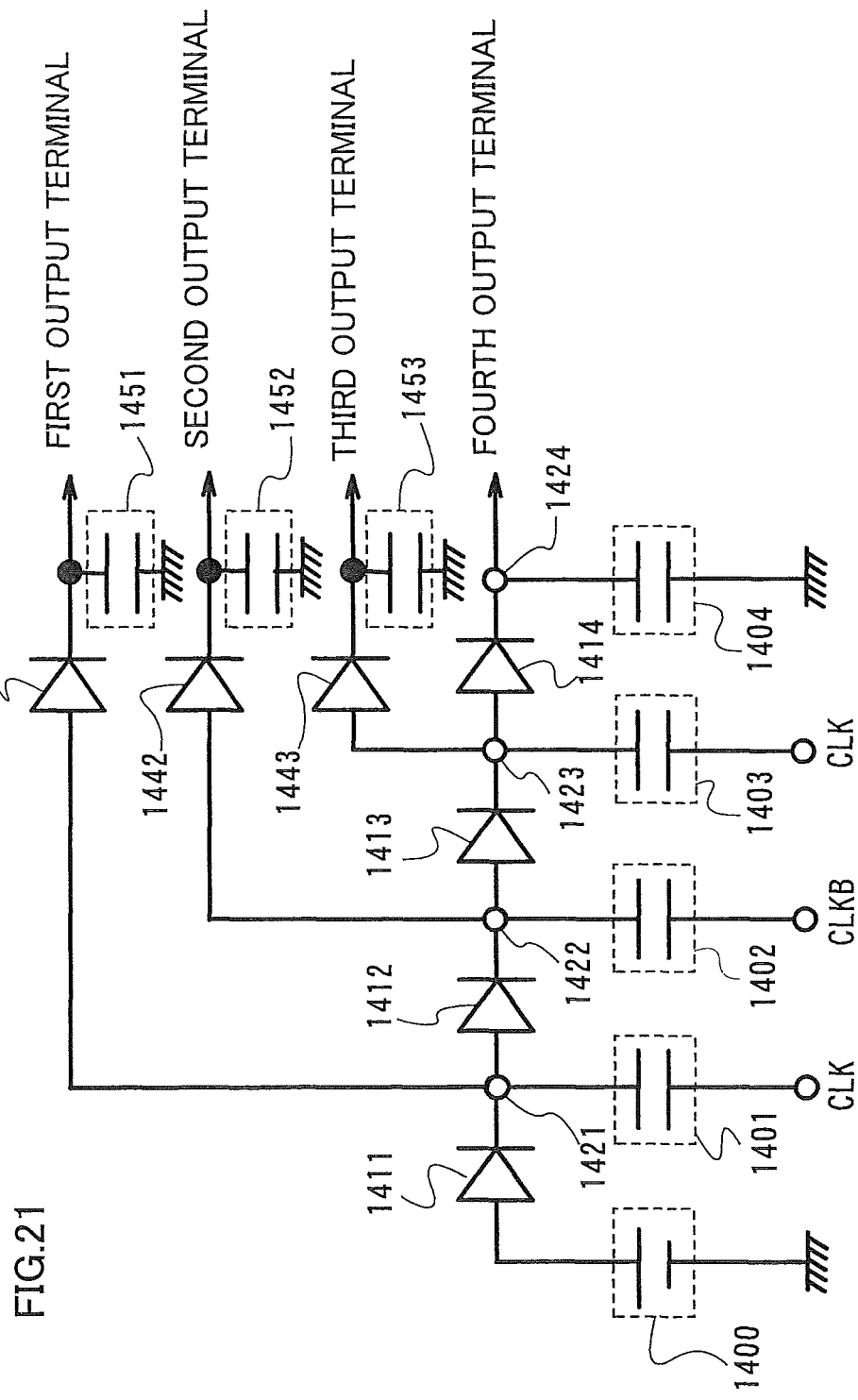
FIG. 21 is a diagram showing a voltage step-up circuit.

That is, as the stabilized power source circuits 1431, 1432, and 1433, they can be constituted by a rectifying element and a capacitor element as shown in FIG. 21. The stabilized power source circuit 1431 is constituted by a rectifying element 1441 and a capacitor element 1451, the stabilized power source circuit 1432 is constituted by a rectifying element 1442 and a capacitor element 1452, and the stabilized power source circuit 1433 is constituted by a rectifying element 1443 and a capacitor element 1453.

Note that described here is an operation of the stabilized power source circuit constituted by the rectifying element 1441 and the capacitor element 1451.

As described above, the potential of the intersection point 1421 becomes the potential of Vref and the potential of Vref+v alternately. Then, when the potential of the intersection point 1421 is Vref+v, a current flows into the rectifying element 1441 and a charge is accumulated in the capacitor element 1451. On the other hand, when the potential of the intersection point 1421 is Vref, a current does not flow since a voltage applied to the rectifying element 1441 is a reverse-biased voltage. Therefore, a current is supplied from the intersection point 1421 such that a charge for a certain voltage is accumulated in the capacitor element 1451. In addition, even if the charge accumulated in the capacitor element 1451 is discharged from the first output terminal, by increasing the electrostatic capacitance of the capacitor element 1451, the fluctuation of the potential obtained from the first output terminal can be suppressed.

Note that as for the second output terminal and the third output terminal, they are similar to the above, and thus, the description thereof is omitted herein.

Figure 22A:
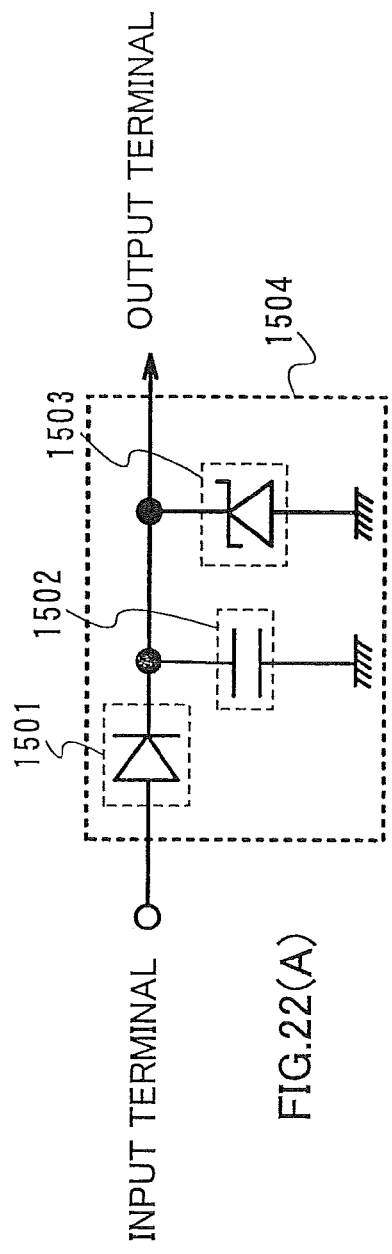
FIGS. 22(A)-22(B) are diagrams showing stabilized power source circuits.
Figure 22B:
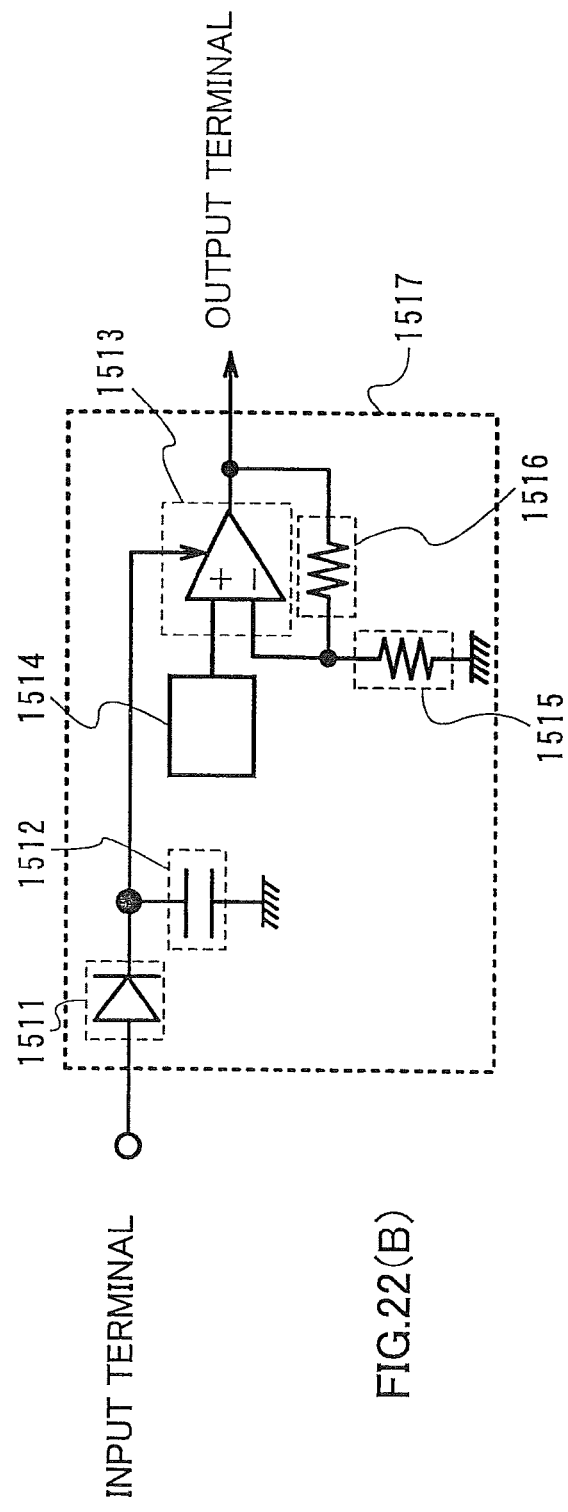

Other constitutions of a stabilized power source circuit (regulator) applicable to the stabilized power source circuit 1431, the stabilized power source circuit 1432, and the stabilized power source circuit 1433 are shown in FIGS. 22(*a*) and 22(*b*). According to the configurations of FIGS. 22(*a*) and 22(*b*), respective predetermined potentials which are lower than the highest potentials obtained from the intersection points 1421, 1422, and 1423 can be obtained from the first to third output terminals.

The configuration of FIG. 22(*a*) is described. Before obtaining the output from the output terminal, one terminal of a zener diode is connected, and the other element thereof is connected to GND. Consequently, a current flows to the zener diode when the potential of the output exceeds a certain potential, so that the potential of the output terminal can be adjusted.

A stabilized power source circuit 1504 is constituted by a rectifying element 1501, a capacitor element 1502, and a zener diode 1503.

An unstabilized potential is inputted from an input terminal of the stabilized power source circuit 1504. Then, when the unstabilized potential is H level, a current flows to the rectifying element 1501 and a charge is accumulated in the capacitor element 1502. That is, the rectifying element 1501 supplies a current to the capacitor element 1502 so as to be the potential of H level of the unstabilized potential. That is, a charge is accumulated in the capacitor element 1502. In addition, by connecting the zener diode 1503 to the capacitor element 1502 in parallel, the accumulated charge is discharged when a voltage between electrodes of the capacitor element 1502 exceeds a certain voltage. That is, the zener diode 1503 functions to reduce the voltage when the voltage between the electrodes of the capacitor element 1502 exceeds the certain voltage.

In addition, the capacitor element 1502 with large electrostatic capacitance is used. In this manner, the voltage between the electrodes of the capacitor element 1502 can be kept to be constant and from an output terminal of the stabilized power source circuit 1504, a constant potential can be obtained.

Note that the input terminal of the stabilized power source circuit 1504 can be connected to any one of the intersection points 1421, 1422, and 1423, or the like in FIG. 20, and the output terminal of the stabilized power source circuit 1504 can be any one of the first output terminal, the second output terminal, and the third output terminal of the charge pump in FIG. 20.

In addition, the stabilized power source circuit 1504 can be applied to the stabilized power source circuits 1431, 1432, and 1433 in FIG. 20; however, it can also be used for stabilizing the output from the fourth output terminal. In that case, the rectifying element 1501 and the capacitor element 1502 correspond to the rectifying element 1414 and the capacitor element 1404 in FIG. 20 respectively. Therefore, by providing the zener diode 1503 so as to be in parallel to the capacitor element 1404, the potential of the fourth output terminal can be an arbitrary potential.

In addition, the number of the zener diodes 1503 is not limited to one and a plurality thereof may be provided in series to adjust the potential. For example, in the stabilized power source circuits 1431, 1432, and 1433, the output terminal 1424, and the like, a plurality of zener diodes may be provided in accordance with respective potentials. In addition, zener diodes of which breakdown potentials are different may be connected in series to adjust the potential as well.

Next, a stabilized power source circuit 1517 shown in FIG. 22(*b*) is described.

The stabilized power source circuit 1517 is constituted by a rectifying element 1511, a capacitor element 1512, an amplifier 1513, a first resistor 1515, and a second resistor 1516. An input terminal of the stabilized power source circuit 1517 is connected to the intersection point 1421, 1422, or 1423, or the like. The potential of the intersection point 1421, 1422, or 1423, or the like becomes H level and L level in accordance with the timing of the clock pulse (CLK) or the clock inverted pulse0 (CLKB). Therefore, as a potential which is inputted to the input terminal of the stabilized power source circuit 1517, the potential of H level or L level is inputted. Then, when the potential of the input terminal is H level, a current flows to the rectifying element 1511 and a charge is accumulated in the capacitor element 1512. In this manner, a current is supplied from the rectifying element 1511 such that a voltage between electrodes of the capacitor element 1512 becomes constant.

This voltage between the electrodes of the capacitor element 1512 is used as a power source of the amplifier 1513. To a non-inverted input terminal of the amplifier 1513, a constant voltage is inputted from a reference power source 1514. In addition, an inverted input terminal of the amplifier 1513 is connected to an output terminal through the second resistor 1516, and further, the inverted input terminal is connected to a ground power source GND through the resistor 1515. Note that a high-gain amplifier is used as the amplifier 1513.

In the amplifier 1513, a voltage of the reference power source 1514 is inputted to the non-inverted input terminal whereas a voltage by resistance-dividing an output voltage of the amplifier 1513 with the second resistor 1516 and the first resistor 1515 is inputted to the inverted input terminal, and these voltage values are compared to each other.

An output voltage $V_0$ of the amplifier 1513 can be expressed by the following formula (1) where the voltage of the reference power source 1514 is $V_r$, a resistance value of the first resistor 1515 is $R_1$, and a resistance value of the second resistor 1516 is $R_2$.

$$V_0 = V_r \frac{R1 + R2}{R1} \quad (1)$$

Accordingly, an output potential of the amplifier 1513 can be adjusted by a rate $R_2/R_1$ between the capacitance values of the first resistor 1515 and the second resistor 1516. That is, to the output terminal of the stabilized power source circuit 1517, a potential which is equal to or higher than the potential of the reference power source 1514 and equal to or lower than the potential of H level inputted to the input terminal of the stabilized power source circuit 1517 can be arbitrarily set.

Note that a plurality of FIG. 22(*b*) may be provided in the end of the output terminal 1424 to output a plurality of potentials as well. However, in the case of a low output potential, a large voltage is applied to the amplifier 1513 so that a power consumption becomes large. Therefore, FIG. 22(*b*) may be provided in each terminal of the stabilized power source circuits 1431, 1432, and 1433 so that the most appropriate potential may be outputted as well. As a result of this, the power consumption can be reduced.

Further, the potential may be obtained from each of the first to fourth output terminals through a smoothing circuit instead of the regulator as well.

In addition, a means for detecting the output potential may be provided before obtaining an output from the output terminal. Then, when the output potential exceeds a certain set potential, inputting of the clock signal (CLK) or the clock inverted signal (CLKB) inputted to the second electrode of the capacitor element may be stopped.

It is to be noted that the description is made based on the assumption that the rectifying elements 1411, 1412, 1413, and 1414 are ideal rectifying elements of which a forward threshold voltage is 0 V. In reality, when there is a forward threshold voltage Vth of the rectifying element 1411, the potential of the intersection point 1421 becomes a potential of Vref−Vth or a potential of Vref−Vth+v. In addition, since decrease occurs by the threshold voltage per the rectifying element interposed therebetween, the threshold voltage of the rectifying element is desirably low. Note that a circuit for correcting for the threshold voltage of the rectifying element may be provided.

As the rectifying element, a diode-connected transistor, a PN junction or PIN junction diode, a Schottky diode, or a carbon nanotube diode can be used.

Alternatively, a switch which is turned on only when a forward bias of the rectifying element is applied, in synchronism with the clock signal (CLK) or the clock inverted signal (CLKB) may be used as the rectifying element. As the switch, a transistor can be used.

Note that it is needless to say that the numbers of the rectifying elements and the capacitor elements, and the amplitudes of the clock signal and the clock inverted signal may be arbitrarily set to adjust the potential obtained from the output terminal arbitrarily. In addition, the output terminal may be between arbitrary rectifying elements in the rectifying elements connected in series. Therefore, the output terminal provided is not necessarily provided depending on between the rectifying elements.

It is to be noted that the output from the voltage step-up circuit of this constitution can be used for the high power source potential described in Embodiment 1 (for example, VHr, VHg, YHb, or the like).

Figure 27:
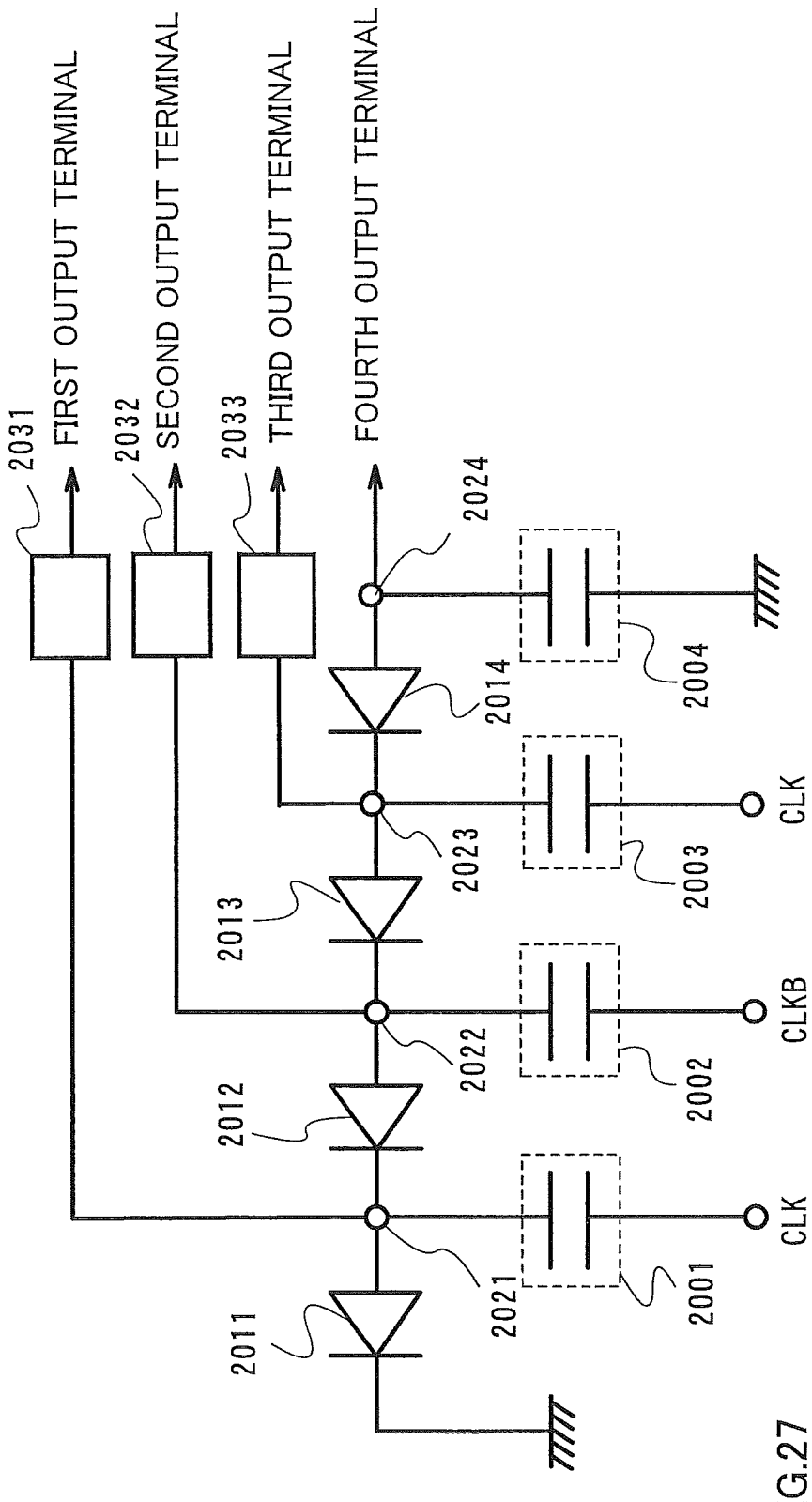
FIG. 27 is a diagram showing a voltage step-down circuit.

In addition, the description is made on the charge pump for generating a different plurality of high power source potentials; however, a different plurality of low power source potentials may be generated as well. In that case, the direction of the rectifying elements connected in series are reversed as shown in FIG. 27 so that the high potential side and the low potential side of the constant voltage source are reversed.

A capacitor element 2001, a capacitor element 2002, a capacitor element 2003, a capacitor element 2004, a rectifying element 2011, a rectifying element 2012, a rectifying element 2013, and a rectifying element 2014 are included. The rectifying element 2011, the rectifying element 2012, the rectifying element 2013, and the rectifying element 2014 are connected in series, and an output terminal of the rectifying element 2011 is connected to GND. An input terminal of the rectifying element 2011 is connected to an output terminal of the rectifying element 2012 at an intersection point 2021, an input terminal of the rectifying element 2012 is connected to an output terminal of the rectifying element 2013 at an intersection point 2022, and an input terminal of the rectifying element 2013 is connected to an output terminal of the rectifying element 2014 at the intersection point 1423. In addition, a first electrode of the capacitor element 2001 is connected to the intersection point 2021, and to a second electrode thereof, the clock signal (CLK) is inputted. In addition, a first electrode of the capacitor element 2002 is connected to the intersection point 2022, and to a second electrode thereof, the clock inverted signal (CLKB) is inputted. In addition, a first electrode of the capacitor element 2003 is connected to the intersection point 2023, and to a second electrode thereof, the clock signal (CLK) is inputted. In addition, a first electrode of the capacitor element 2004 is connected to an input terminal 2024 of the rectifying element 2014 and a second terminal thereof is connected to GND.

Respective potentials obtained from the intersection point 2021, the intersection point 2022, and the intersection point 2023 are made to be constant potentials by stabilized power source circuits 2031, 2032, and 2033 to be the first output terminal, the second output terminal, and the third output terminal. In addition, in order to make the potential of the input terminal 2024 of the rectifying element 2014 constant, the capacitor element 2004 with large electrostatic capacitance is used. As a result, since a charge capable of being stored in the capacitor element 2004 becomes large, the fluctuation of the potential can be suppressed. In addition, as the stabilized power source circuit (regulator), the constitution described as for the voltage step-up circuit can be arbitrarily used.

Therefore, the output from this voltage step-down circuit can be used for the low power source potential described in Embodiment 1 (for example, VLr, VLg, YLb, or the like).

In addition, the clock pulse (CLK) or the clock inverted pulse (CLKB) is inputted to the charge pump in this embodiment; however, a second electrode of a capacitor element 1902 is connected to a high potential side of a constant voltage source 1901 through a first switch 1903 and a low potential side thereof is connected to GND. In addition, the second electrode of the capacitor element 1902 is connected to GND through a switch 1904. Then, the switch 1903 and the switch 1904 may be turned on/off alternatively. In this case, depending on whether the capacitor element 1902 is the capacitor element 1401 or the capacitor element 1402 shown in FIG. 20, the on/off of the switches 1903 and 1904 may be reversed.

That is, by using the charge pump described in this embodiment, an arbitrarily power source potential can be generated by a simple constitution. Accordingly, in the light-emitting devices described in Embodiment Modes 1 to 6, respective voltage can be applied for light-emitting elements of which emission colors are different.

What is claimed is:

1. A light-emitting device comprising:
   a first light-emitting element comprising a first light-emitting layer between a first electrode and a second electrode;
   a second light-emitting element comprising a second light-emitting layer between a third electrode and a fourth electrode;
   a third light-emitting element comprising a third light-emitting layer between a fifth electrode and a sixth electrode; and
   a fourth light-emitting element comprising the first light-emitting layer, the second light-emitting layer, and the third light-emitting layer between a seventh electrode and an eighth electrode,
   wherein the first light-emitting layer is shared by the first light-emitting element and the fourth light-emitting element,
   wherein the first light-emitting layer is not included in the second light-emitting element and the third light-emitting element,
   wherein the first light-emitting layer is configured to emit a first color,
   wherein the second light-emitting layer is configured to emit a second color, and
   wherein the third light-emitting layer is configured to emit a third color.

2. The light-emitting device according to claim 1, further comprising a charge generation layer between the first light-emitting layer and the second light-emitting layer in the fourth light-emitting element.

3. The light-emitting device according to claim 1,
   wherein the first light-emitting element, the second light-emitting element, and the fourth light-emitting element are arranged in a line in a first direction,
   wherein the third light-emitting element and the fourth light-emitting element are arranged in a line in a second direction, and
   wherein the first direction is vertical to the second direction.

4. The light-emitting device according to claim 1, wherein the second electrode, the fourth electrode, the sixth electrode, and the eighth electrode are the same layer.

5. The light-emitting device according to claim 1, wherein the second electrode, the fourth electrode, the sixth electrode, and the eighth electrode are electrically connected to one another.

6. The light-emitting device according to claim 1, wherein the first electrode, the third electrode, the fifth electrode, and the seventh electrode are separated from one another.

7. The light-emitting device according to claim 1, wherein at least one of the first light-emitting layer, the second light-emitting layer, and the third light-emitting layer comprises a substance exhibiting emission from a triplet excited state.

8. The light-emitting device according to claim 1, wherein the first color, the second color, and the third color are red, green and blue, respectively.

9. The light-emitting device according to claim 1, wherein the fourth light-emitting element is configured to emit white light.

10. A light-emitting device comprising:
    a first light-emitting element comprising a first light-emitting layer between a first electrode and a second electrode;
    a second light-emitting element comprising a second light-emitting layer between a third electrode and a fourth electrode; and
    a third light-emitting element comprising the first light-emitting layer and the second light-emitting layer between a fifth electrode and a sixth electrode,
    wherein the first light-emitting layer is shared by the first light-emitting element and the third light-emitting element,
    wherein the first light-emitting layer is not included in the second light-emitting element,
    wherein the first light-emitting layer is configured to emit a first color, and
    wherein the second light-emitting layer is configured to emit a second color.

11. The light-emitting device according to claim 10, further comprising a charge generation layer between the first light-emitting layer and the second light-emitting layer in the third light-emitting element.

12. The light-emitting device according to claim 10,
    wherein the first light-emitting element and the third light-emitting element are arranged in a line in a first direction,
    wherein the second light-emitting element and the third light-emitting element are arranged in a line in a second direction, and
    wherein the first direction is vertical to the second direction.

13. The light-emitting device according to claim 10, wherein the second electrode, the fourth electrode, and the sixth electrode are the same layer.

14. The light-emitting device according to claim 10, wherein the second electrode, the fourth electrode, and the sixth electrode are electrically connected to one another.

15. The light-emitting device according to claim 10, wherein the first electrode, the third electrode, and the fifth electrode are separated from one another.

16. The light-emitting device according to claim 10, wherein at least one of the first light-emitting layer and the second light-emitting layer comprises a substance exhibiting emission from a triplet excited state.

17. The light-emitting device according to claim 10, wherein the first color and the second color are blue and yellow, respectively.

18. The light-emitting device according to claim 10, wherein the third light-emitting element is configured to emit white light.

* * * * *